(12) United States Patent
Guarino et al.

(10) Patent No.: US 12,484,185 B2
(45) Date of Patent: Nov. 25, 2025

(54) COLD PLATE HEAT EXCHANGER AND CORRESPONDING PRODUCTION PROCESS BY ADDITIVE MANUFACTURING

(71) Applicant: KORAL TECHNOLOGIES S.R.L., Trento (IT)

(72) Inventors: Roberto Guarino, Trento (IT); Sergio Guarino, Trento (IT)

(73) Assignee: KORAL TECHNOLOGIES S.R.L., Trento (IT)

( * ) Notice: Subject to any disclaimer, the term of this patent is extended or adjusted under 35 U.S.C. 154(b) by 250 days.

(21) Appl. No.: 18/261,997

(22) PCT Filed: Jan. 24, 2022

(86) PCT No.: PCT/IB2022/050590
§ 371 (c)(1),
(2) Date: Jul. 18, 2023

(87) PCT Pub. No.: WO2022/157727
PCT Pub. Date: Jul. 28, 2022

(65) Prior Publication Data
US 2024/0107703 A1 Mar. 28, 2024

(30) Foreign Application Priority Data
Jan. 25, 2021 (IT) .................. 102021000001247

(51) Int. Cl.
*H05K 7/20* (2006.01)
*B33Y 10/00* (2015.01)
(Continued)

(52) U.S. Cl.
CPC .......... *H05K 7/20254* (2013.01); *B33Y 10/00* (2014.12); *B33Y 40/20* (2020.01);
(Continued)

(58) Field of Classification Search
CPC .......... H05K 7/20254; H05K 7/20281; H05K 7/20927; B33Y 10/00; B33Y 40/20;
(Continued)

(56) References Cited

U.S. PATENT DOCUMENTS 7,552,759 B2  6/2009  Liu et al.
7,905,275 B2* 3/2011  Behrens ................ H05K 7/205
                                              165/80.4
(Continued)

OTHER PUBLICATIONS

ISA European Patent Office, International Search Report Issued in Application No. PCT/IB2022/050590, Apr. 13, 2022, WIPO, 2 pages.

*Primary Examiner* — Stephen S Sul
(74) *Attorney, Agent, or Firm* — McCoy Russell LLP

(57) ABSTRACT

A cold plate heat exchanger is disclosed, comprising: a main body comprising at least one active surface suitable to the heat transfer with at least one device in thermal contact with it; at least one channel, in which a coolant flows, formed inside said main body and arranged in proximity of said active surface and in thermal contact with it; and at least two hydraulic interconnections integral with said main body and comprising the respective inlet and outlet ducts of the coolant hydraulically connected to the ends of said internal channel; in which said internal channel is at least partially filled with an ordered lattice structure in thermal contact with the coolant, the ordered lattice structure comprising a periodic repetition of one or more elementary cells along at least one dimension. A method of production by additive manufacturing of a cold plate heat exchanger is also disclosed.

12 Claims, 17 Drawing Sheets

(51) Int. Cl.
  *B33Y 40/20*  (2020.01)
  *B33Y 50/02*  (2015.01)
  *B33Y 80/00*  (2015.01)

(52) U.S. Cl.
  CPC .............. *B33Y 50/02* (2014.12); *B33Y 80/00* (2014.12); *H05K 7/20281* (2013.01)

(58) Field of Classification Search
  CPC ..... B33Y 50/02; B33Y 80/00; F28D 15/0266; F28D 15/043; F28D 15/046; F28D 1/035; F28D 2021/0029; H01M 10/613; H01M 10/625; H01M 2220/20; H01M 10/6556; F28F 3/10; F28F 2215/04; F28F 2230/00; F28F 2270/00; F28F 2270/02; F28F 13/003; F28F 13/12; F28F 13/14; F28F 3/12
  See application file for complete search history.

(56) References Cited

U.S. PATENT DOCUMENTS

| | | | | |
|---|---|---|---|---|
| 10,816,280 | B2* | 10/2020 | Vos | B23P 15/26 |
| 11,129,297 | B2* | 9/2021 | Chan | H05K 7/20509 |
| 2005/0082037 | A1* | 4/2005 | Thayer | F28F 13/003 |
| | | | | 257/E23.098 |
| 2007/0246191 | A1* | 10/2007 | Behrens | F28F 13/003 |
| | | | | 257/E23.113 |
| 2008/0105413 | A1* | 5/2008 | Peng | F28F 13/185 |
| | | | | 165/104.33 |
| 2008/0196869 | A1* | 8/2008 | Behrens | F28F 13/003 |
| | | | | 165/104.33 |
| 2018/0156545 | A1 | 6/2018 | Delano et al. | |
| 2018/0328673 | A1* | 11/2018 | Stoia | F28D 1/05366 |
| 2018/0356168 | A1 | 12/2018 | Ghioni et al. | |
| 2019/0343019 | A1* | 11/2019 | Todorovic | H05K 7/20927 |
| 2020/0309469 | A1 | 10/2020 | Maxwell et al. | |
| 2022/0117115 | A1* | 4/2022 | Malouin | H05K 7/20254 |

* cited by examiner

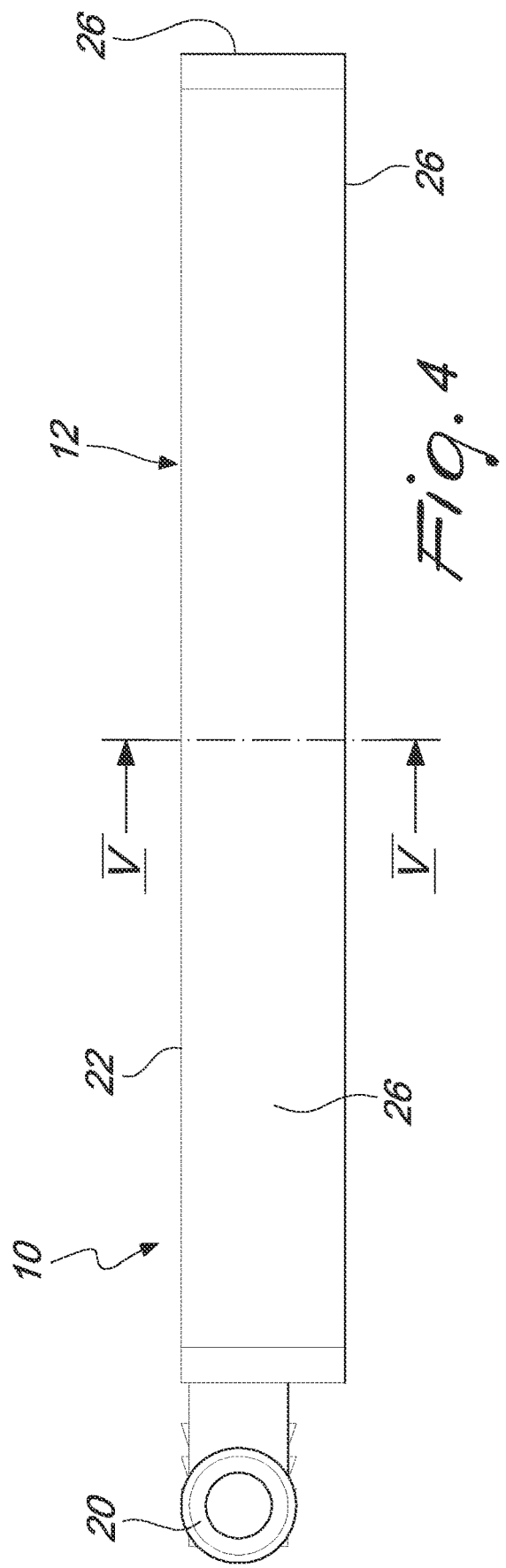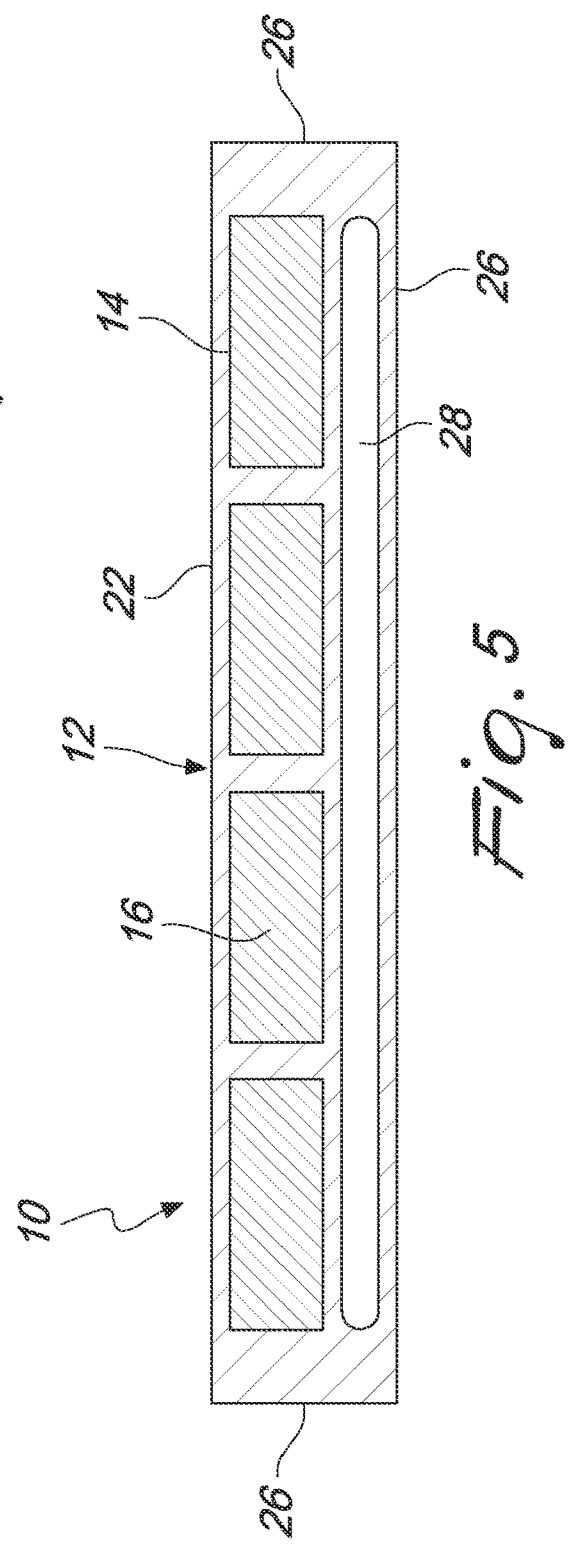

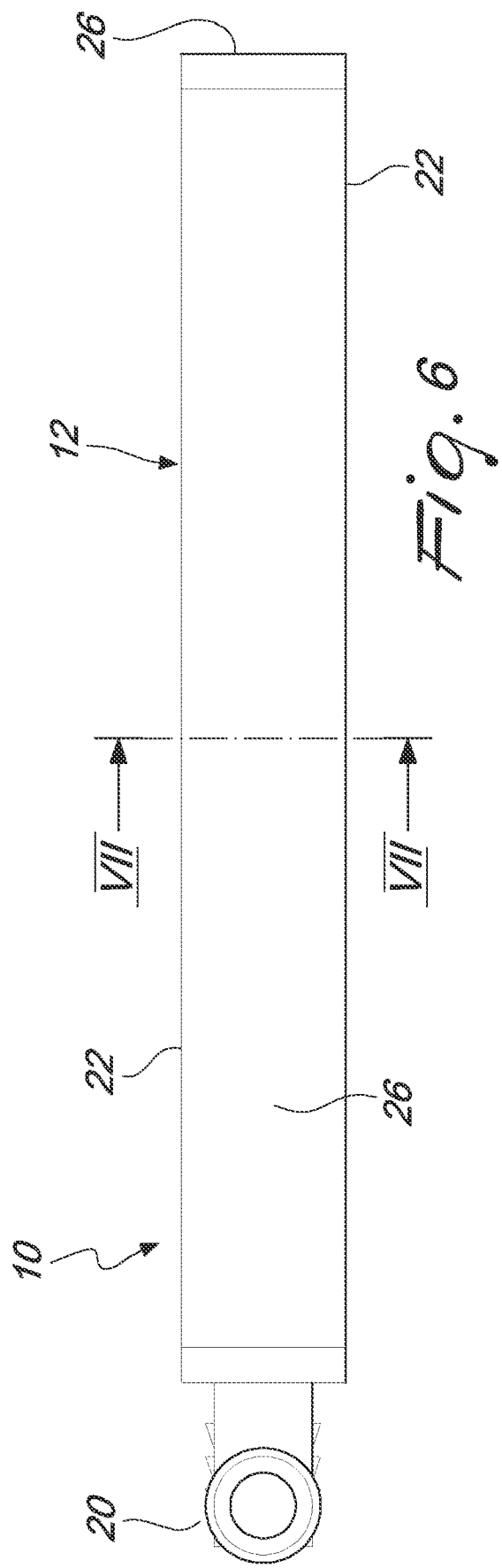
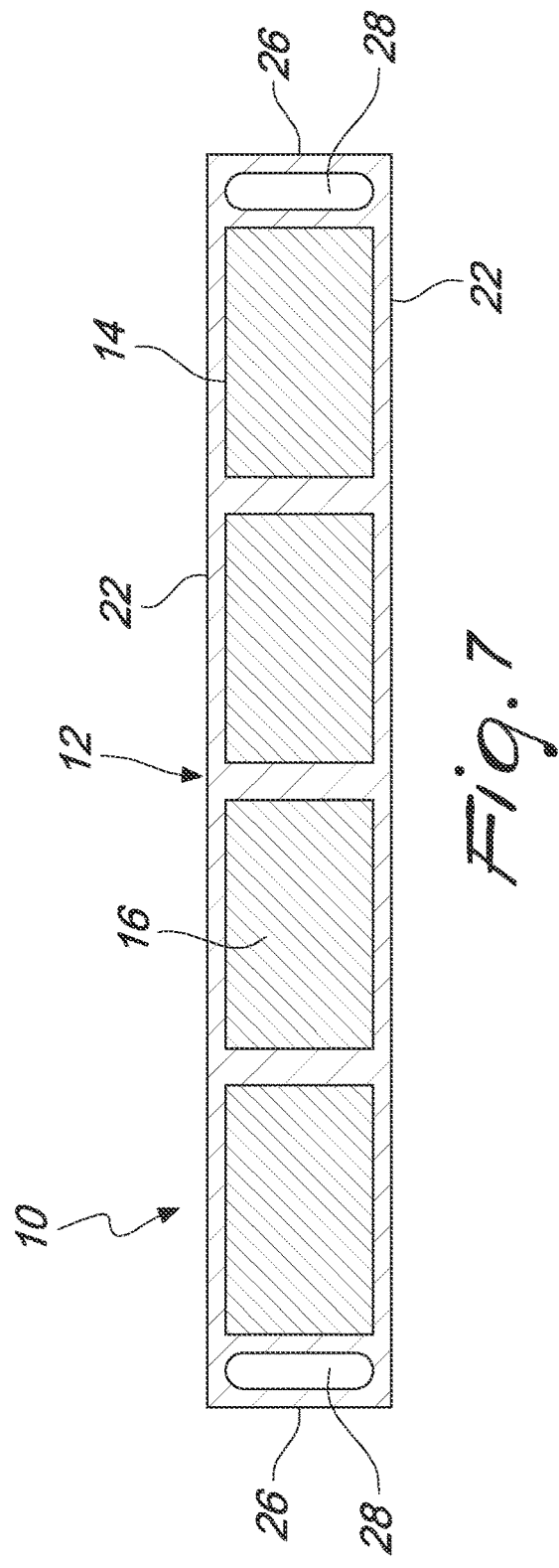

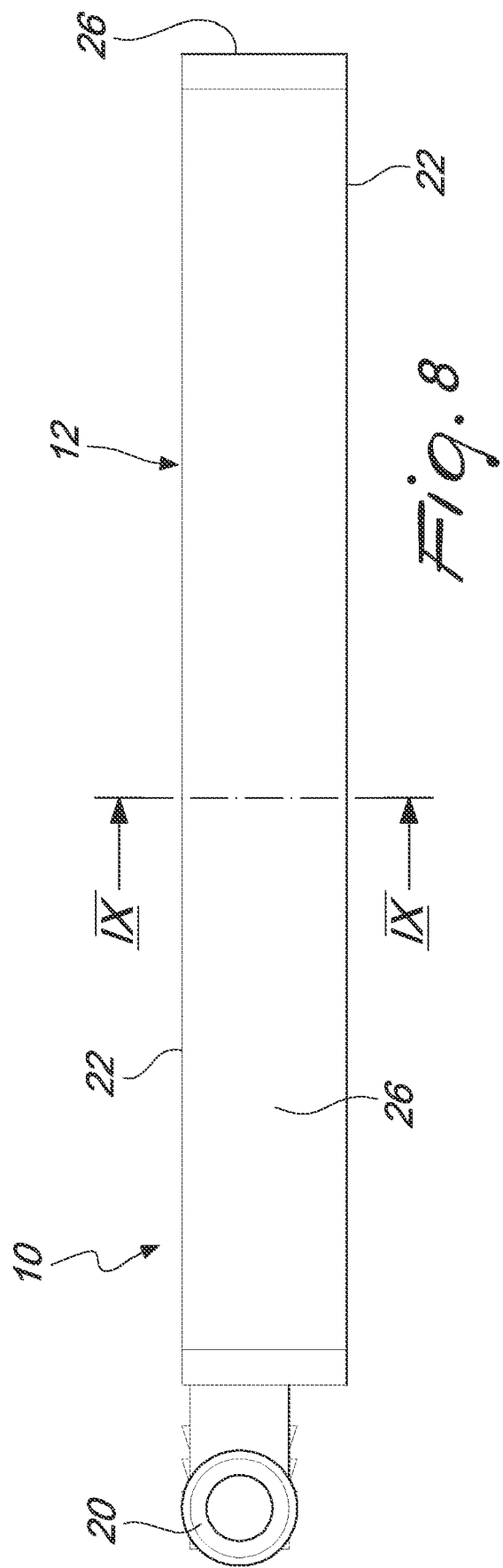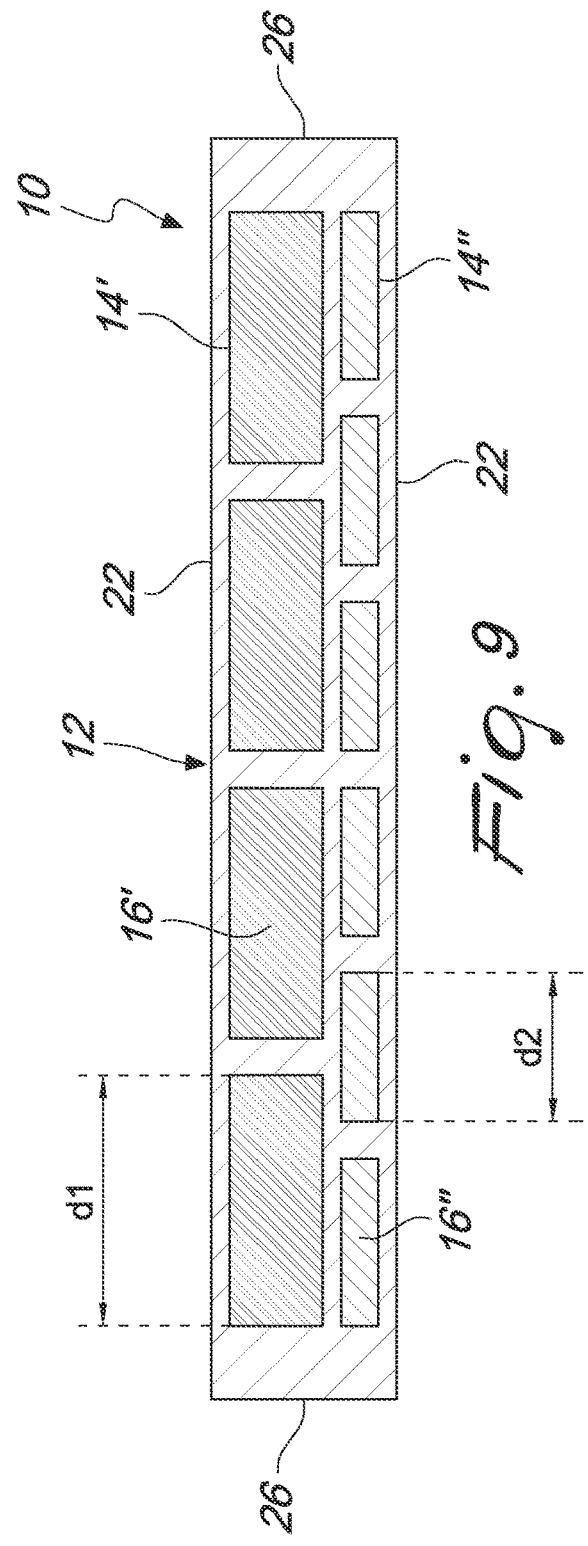

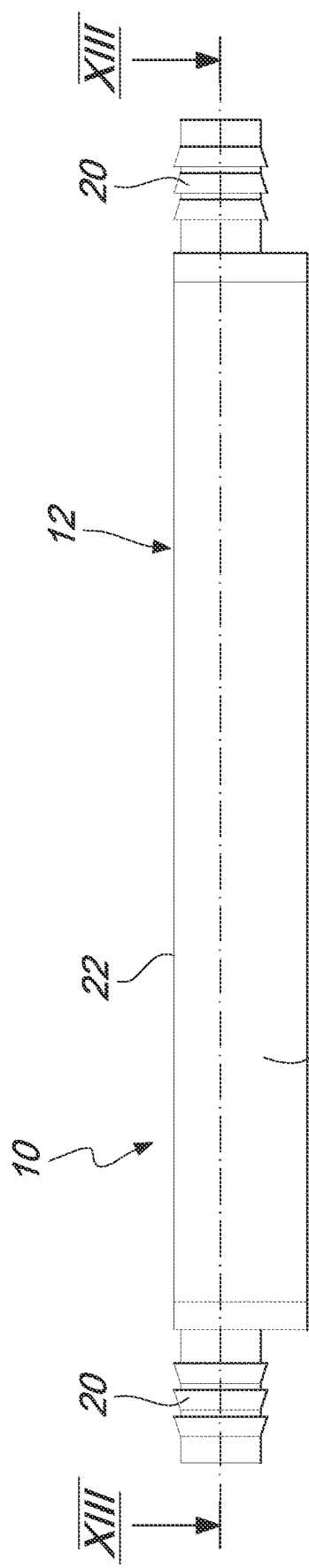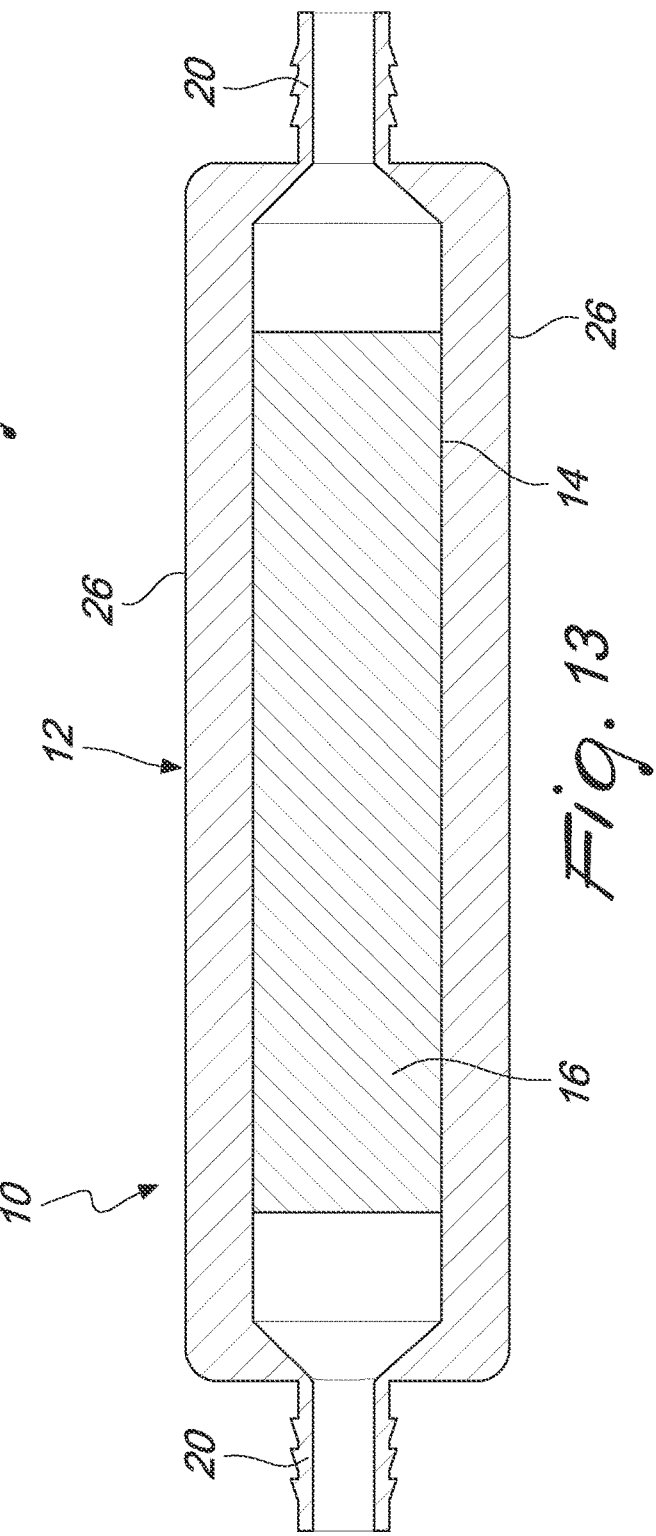

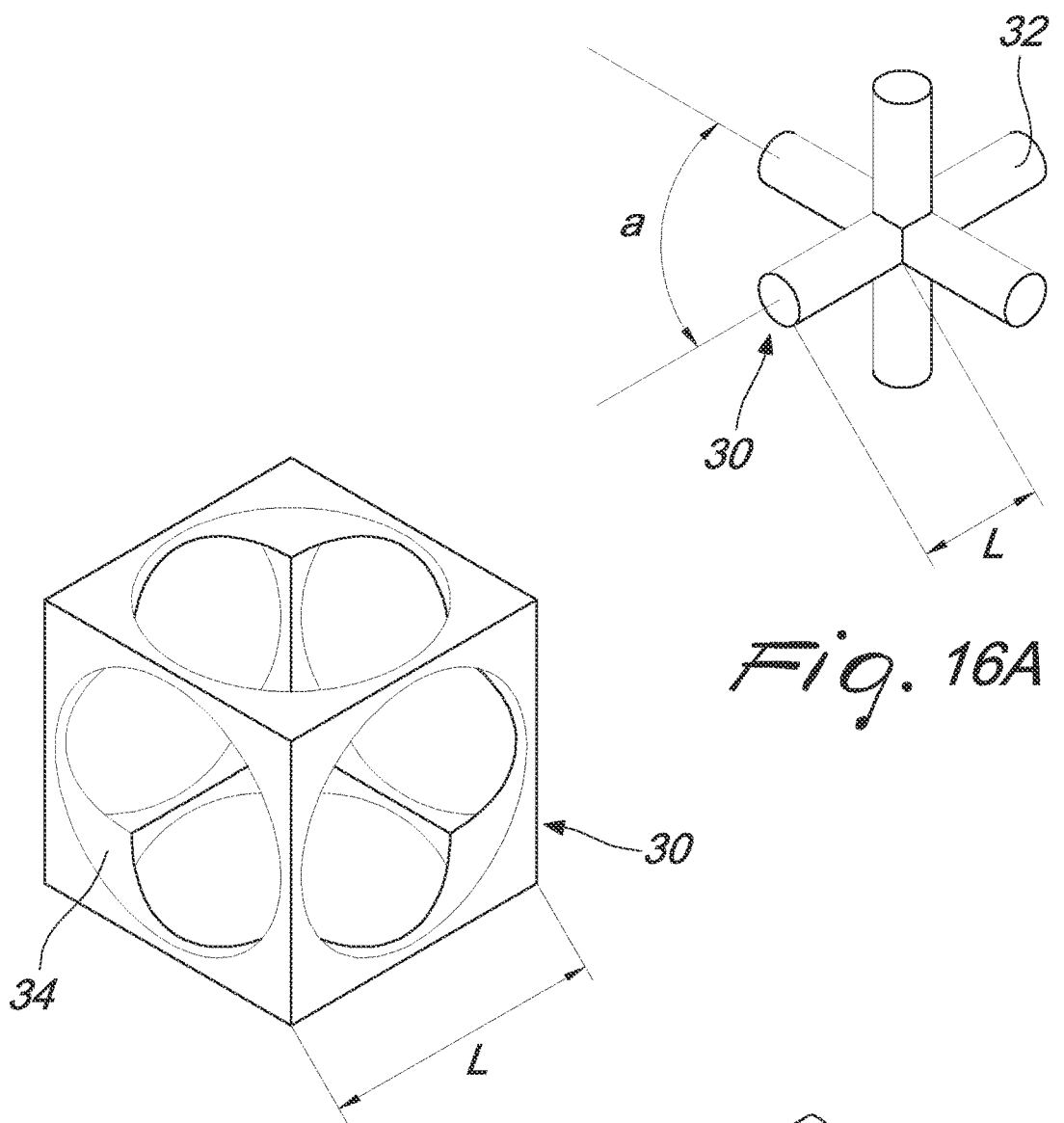
Fig. 16A
Fig. 16B
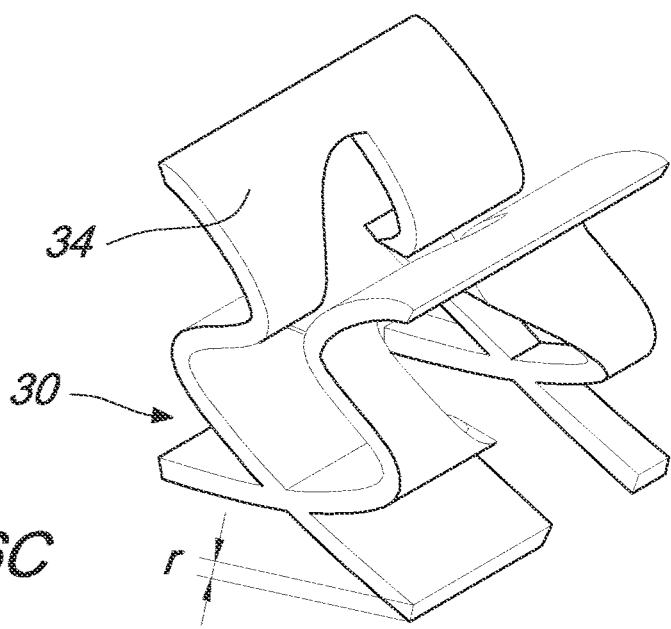
Fig. 16C

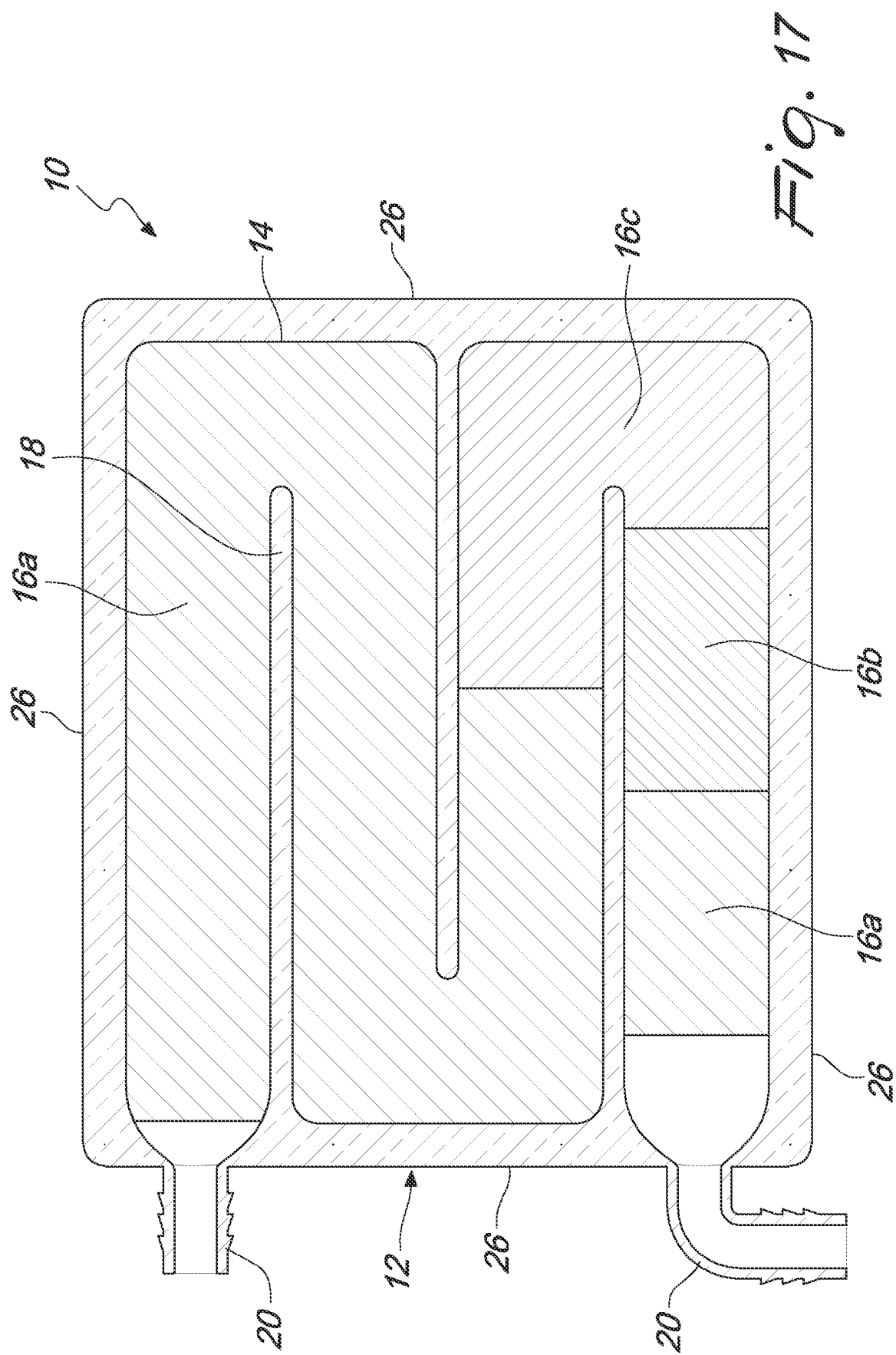

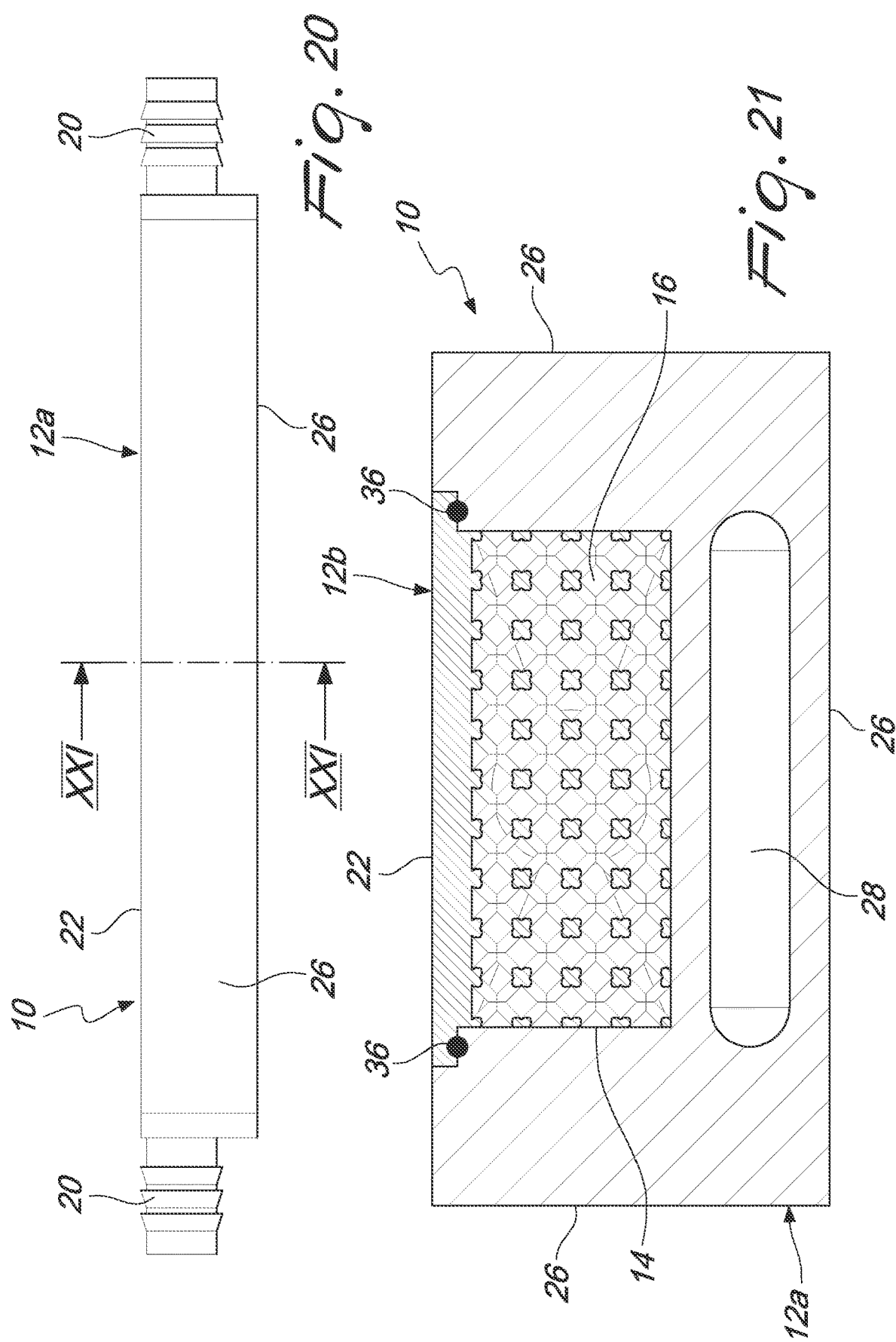

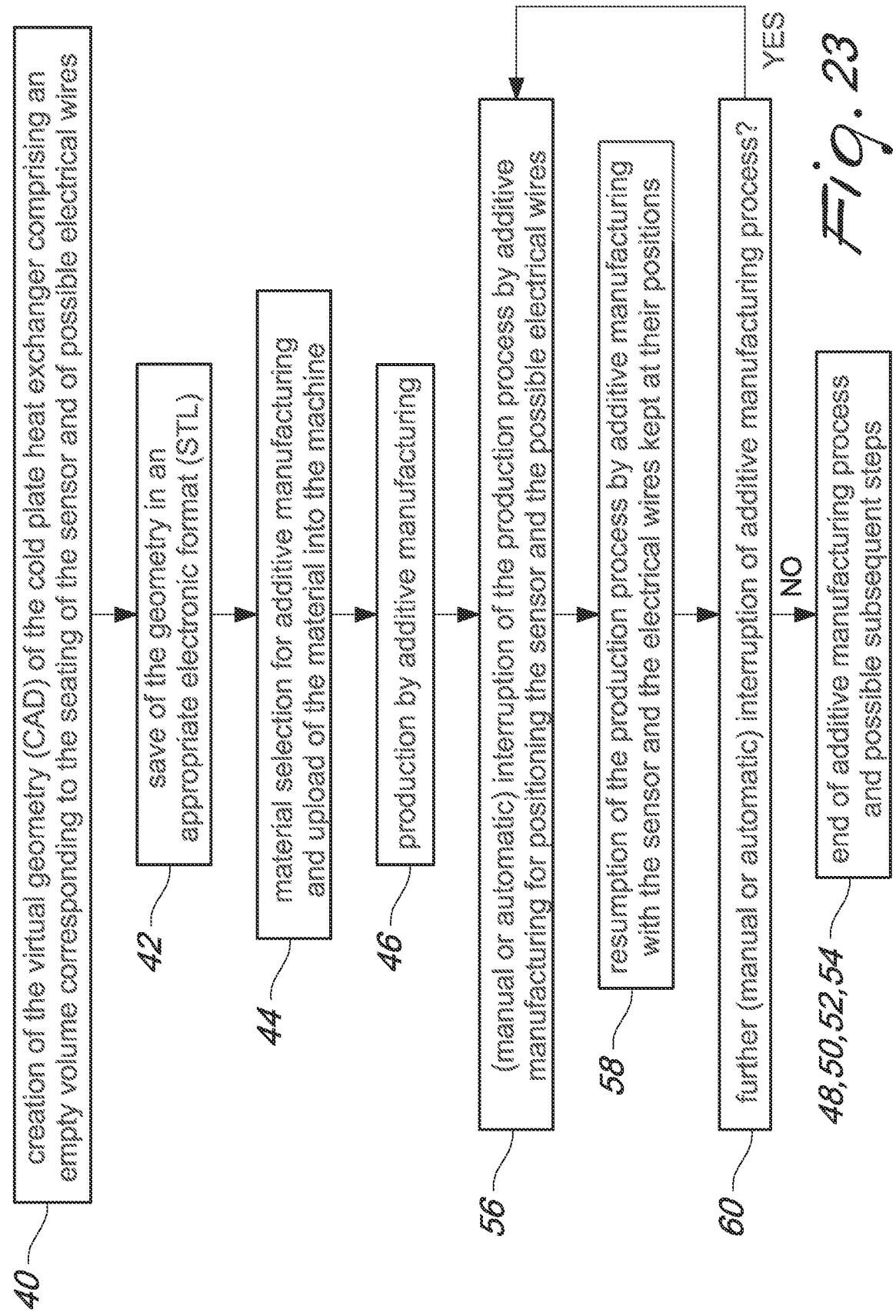

COLD PLATE HEAT EXCHANGER AND CORRESPONDING PRODUCTION PROCESS BY ADDITIVE MANUFACTURING

CROSS REFERENCE TO RELATED APPLICATIONS

The present application is a U.S. National Phase of International Application No. PCT/IB2022/050590 entitled "COLD PLATE HEAT EXCHANGER AND CORRESPONDING PRODUCTION PROCESS BY ADDITIVE MANUFACTURING," and filed on Jan. 24, 2022. International Application No. PCT/IB2022/050590 claims priority to Italian Patent Application No. 102021000001247 filed on Jan. 25, 2021. The entire contents of each of the above-listed applications are hereby incorporated by reference for all purposes.

TECHNICAL FIELD

This disclosure relates to a cold plate heat exchanger specifically, but not exclusively, useful and convenient in the thermal management of power electronics (e.g. insulated gate bipolar transistors, IGBTs) or of rechargeable batteries (or accumulators), i.e. for the heat removal and cooling of these latter.

In addition, this disclosure relates to a production process by additive manufacturing of the above-mentioned cold plate heat exchanger.

BACKGROUND

Nowadays, the development of electronic devices with an always increasing power, and thus, which generate always more power, has brought the necessity to face the corresponding problems of removing the generated heat and of the cooling of the electronic devices themselves, with the aim of improving their efficiency and the performance and/or to extend their operating life. Moreover, in some cases, there is the additional problem of a non-uniform heat generation along a specific surface or within a specific volume of the electronic devices, which creates a consequent distribution of temperature that is, in turn, not uniform.

These issues are particularly relevant in applications that employ rechargeable batteries, for instance the prismatic Lithium-ion cells commonly used in hybrid and electric vehicles. Indeed, in this case, the heat generation is not uniform within the battery volume. Therefore, the battery thermal management system must guarantee not only cooling, but also a sufficient temperature uniformity, in order to avoid a worsening of the capacity and/or of the impedance, or even an irreversible damage, of the battery itself.

Therefore, the minimisation of the temperature difference, e.g. the surface temperature difference ($T_{s,max} - T_{s,min}$), and thus the maximisation of the temperature uniformity, e.g., again, that of the surface, has a fundamental importance for avoiding, or at least to reduce, the worsening of the capacity and/or of the impedance of the battery or, more in general, of the efficiency and/or of the performance of the electronic or other type of device.

At the present time, it is known that the so-called cold plate heat exchangers can be integrated into active systems for the thermal management of batteries and/or of battery packs or, in general, of electronic, mechanical or other devices. These heat exchangers of known type are conceived to be in contact with the external surface of one or more batteries or, in general, with the external surface of the device to be cooled, and to remove heat by means of the forced flow of a coolant.

Specifically, these cold plate heat exchangers comprise cooling plates of the power components with at least one internal channel, or duct, typically in a coil shape, in which the coolant flows. The ends of the channel are directly or indirectly connected to the inlet and outlet of an additional dedicated heat exchanger located outside of the device to be cooled or, in large systems, on the outside of the room, for a higher efficiency.

Nevertheless, these known heat exchangers are not free from inconveniences, since they do not present the characteristics and/or are not configured in order to perform the heat transfer in an optimal in presence of non-uniform, e.g. surface, temperature distributions.

In general, the main requirements of the cold plate heat exchangers are the according to:
- minimisation of the maximum surface temperature ($T_{s,max}$) of the electronic, mechanical or other device to be cooled;
- minimisation of the surface temperature difference ($T_{s,max} - T_{s,min}$), i.e. maximisation of the temperature uniformity;
- minimisation of the pressure drop of the coolant, which in turns affects the electrical power required for the flow of the same;
- minimisation of the weight and volume, above all in applications related to the electric mobility; and
- thermo-mechanical stability and structural resistance.

The aim of the present disclosure is to overcome the limits of the state of the art described above, presenting a cold plate heat exchanger, and a corresponding production process by additive manufacturing, that allow to obtain a higher efficiency with respect to that obtainable with known solutions or, equivalently, a similar efficiency but at a lower price and with increased performance.

It is therefore an object of this invention to provide a cold plate heat exchanger, and a corresponding production process by additive manufacturing, that allow to minimise the maximum surface temperature of the electronic, mechanical or other device to be cooled.

It is another object of this invention to provide a cold plate heat exchanger, and a corresponding production process by additive manufacturing, that allow to maximise the surface temperature uniformity of the electronic, mechanical or other device to be cooled under non-uniform heat sources.

It is another object of this invention to provide a cold plate heat exchanger, and a corresponding production process by additive manufacturing, that allow to have reduced weight and volume of the same heat exchanger for high-performance applications.

Additionally, it is another object of this invention to provide a cold plate heat exchanger, and a corresponding production process by additive manufacturing, that allow to integrate additional functionalities in the heat exchanger itself.

Last but not least, it is another object of this invention to provide a cold plate heat exchanger, and a corresponding production process by additive manufacturing, that present a high reliability, a relatively easy manufacturing, and are economically competitive with respect to the state of the art.

SUMMARY

These and other objects of this invention, which will be better clarified later, are accomplished by providing a cold plate heat exchanger comprising:

a main body comprising at least one active surface suitable to the heat transfer with at least one device in thermal contact with the same;

at least one channel, in which a coolant flows, formed inside said main body and arranged in proximity of and in thermal contact with said active thermal surface; and at least two hydraulic interconnections integral with said main body and comprising the corresponding inlet and outlet ducts of the coolant, hydraulically connected to the ends of said internal channel;

characterised in that said internal channel is at least partially filled with an ordered lattice structure in thermal contact with said coolant, said ordered lattice structure comprising the periodic repetition of one or more elementary cells along at least one dimension.

The aim and the objects of this invention are also achieved by means of a production process by additive manufacturing of a cold plate heat exchanger, characterised in that it comprises the according to steps:

computer design of a virtual geometry of said heat exchanger, in which said virtual geometry comprises one internal channel at least partially filled with an ordered lattice structure comprising a periodic repetition of one or more elementary cells along at least one dimension;

save of said virtual geometry in an appropriate electronic format;

selection of a base material for manufacturing said heat exchanger, and subsequent upload of said base material into an additive manufacturing machine; and production of said heat exchanger by means of said additive manufacturing machine, in which said heat exchanger comprises said internal channel at least partially filled with said ordered lattice structure.

BRIEF DESCRIPTION OF THE DRAWINGS

Additional characteristics and advantages of this disclosure will be better clarified nu the description of an exemplary, but not exclusive, embodiment of the cold plate heat exchanger, and of the corresponding production process by additive manufacturing, according to the invention, depicted as example and not limiting way with the support of the attached drawings, in which:

FIGS. 4 and 5 display, respectively, a lateral view and a section view, specifically along the V-V line in FIG. 4, of a first version of the exemplary embodiment of the cold plate heat exchanger according to the present disclosure shown in FIGS. 1, 2 and 3;

FIGS. 6 and 7 display, respectively, a lateral view and a section view, specifically along the VII-VII line in FIG. 6, of a second version of the exemplary embodiment of the cold plate heat exchanger according to the present disclosure shown in FIGS. 1, 2 and 3;

FIGS. 8 and 9 display, respectively, a lateral view and a section view, specifically along the IX-IX line in FIG. 8, of a third version of the exemplary embodiment of the cold plate heat exchanger according to the present disclosure shown in FIGS. 1, 2 and 3;

FIGS. 12 and 13 display, respectively, a lateral view and a section view, specifically along the XIII-XIII line in FIG. 12, of an exemplary embodiment of the cold plate heat exchanger according to the present disclosure;

Figure 18:
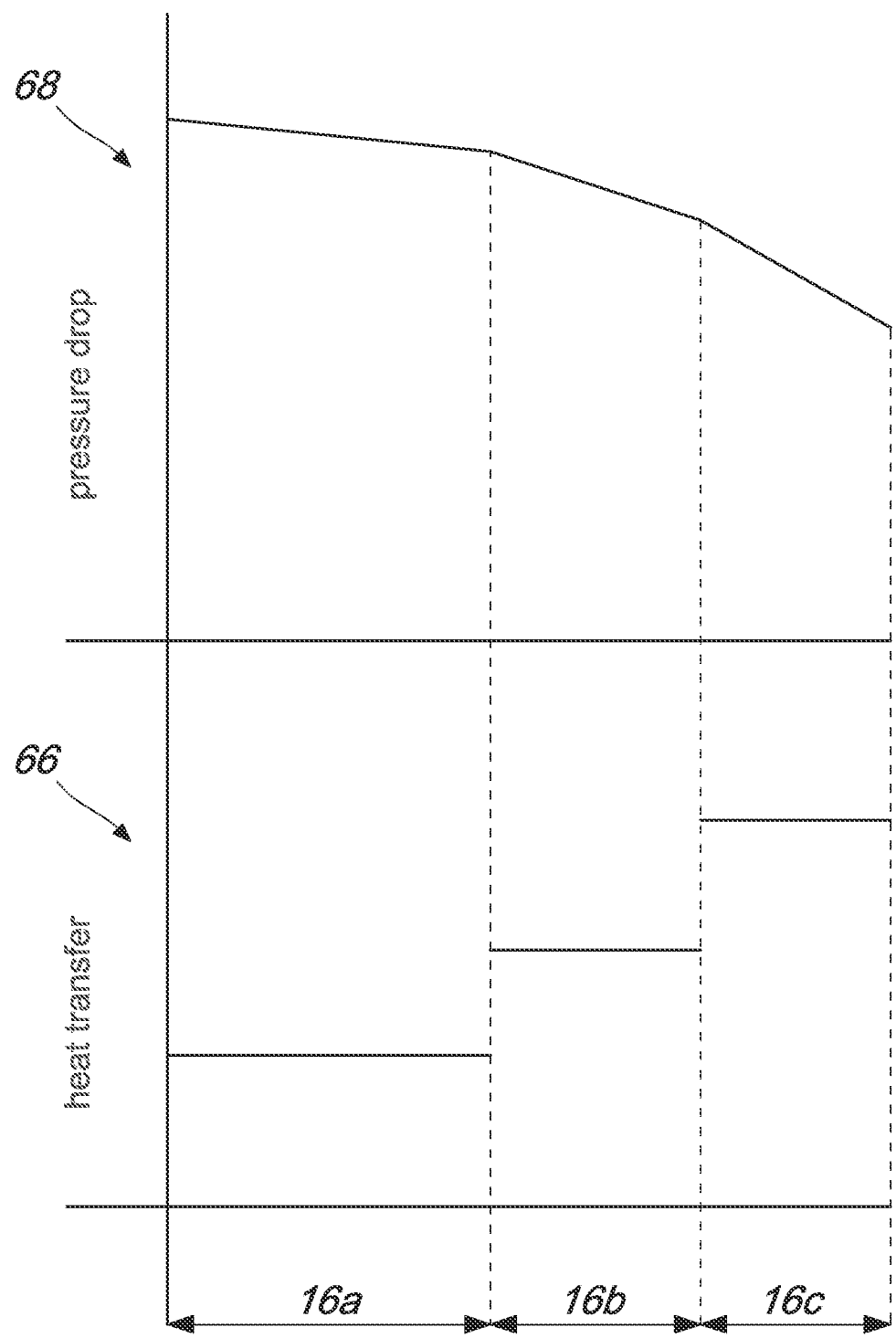
Figure 19:
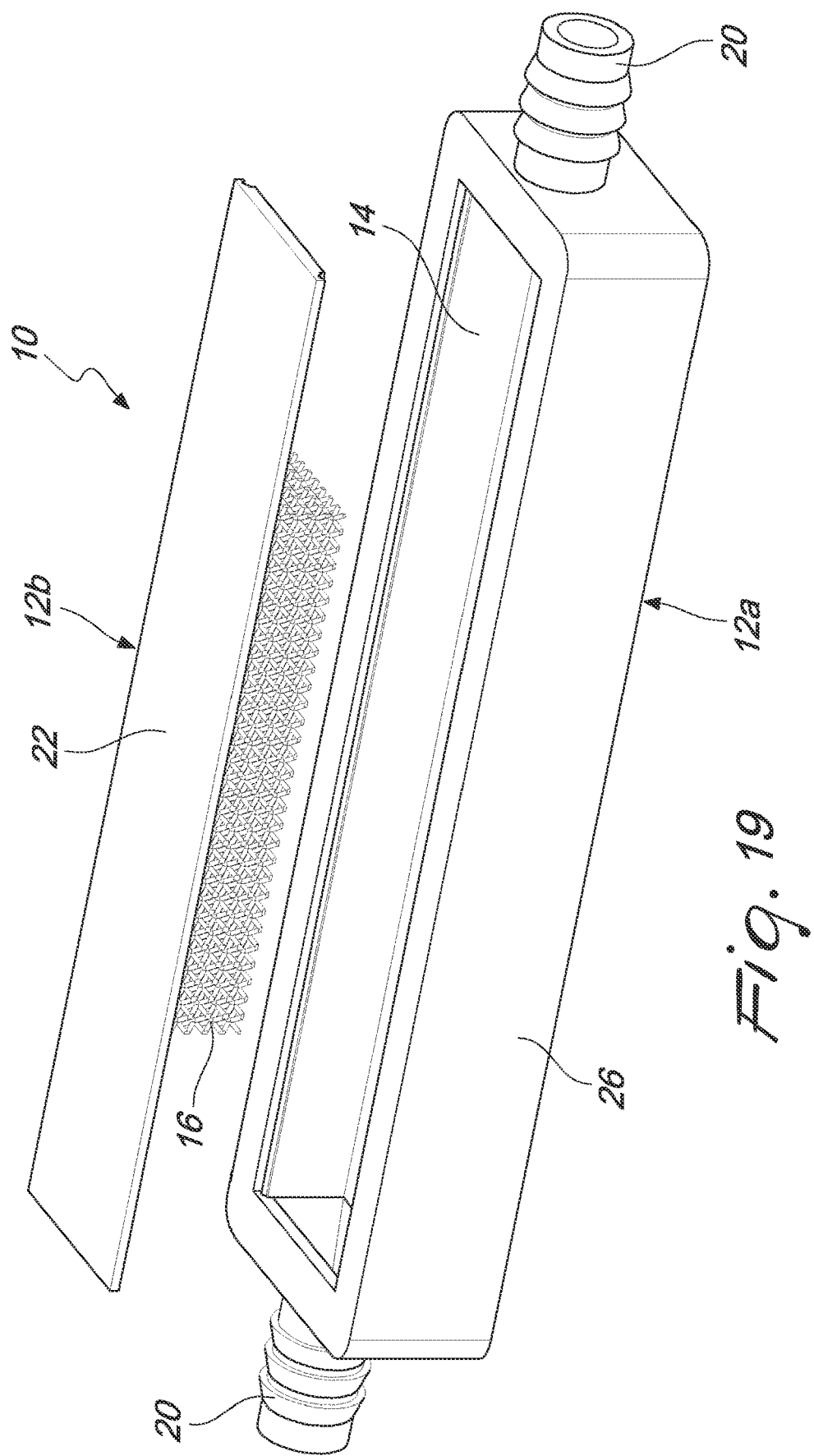
Figure 22:
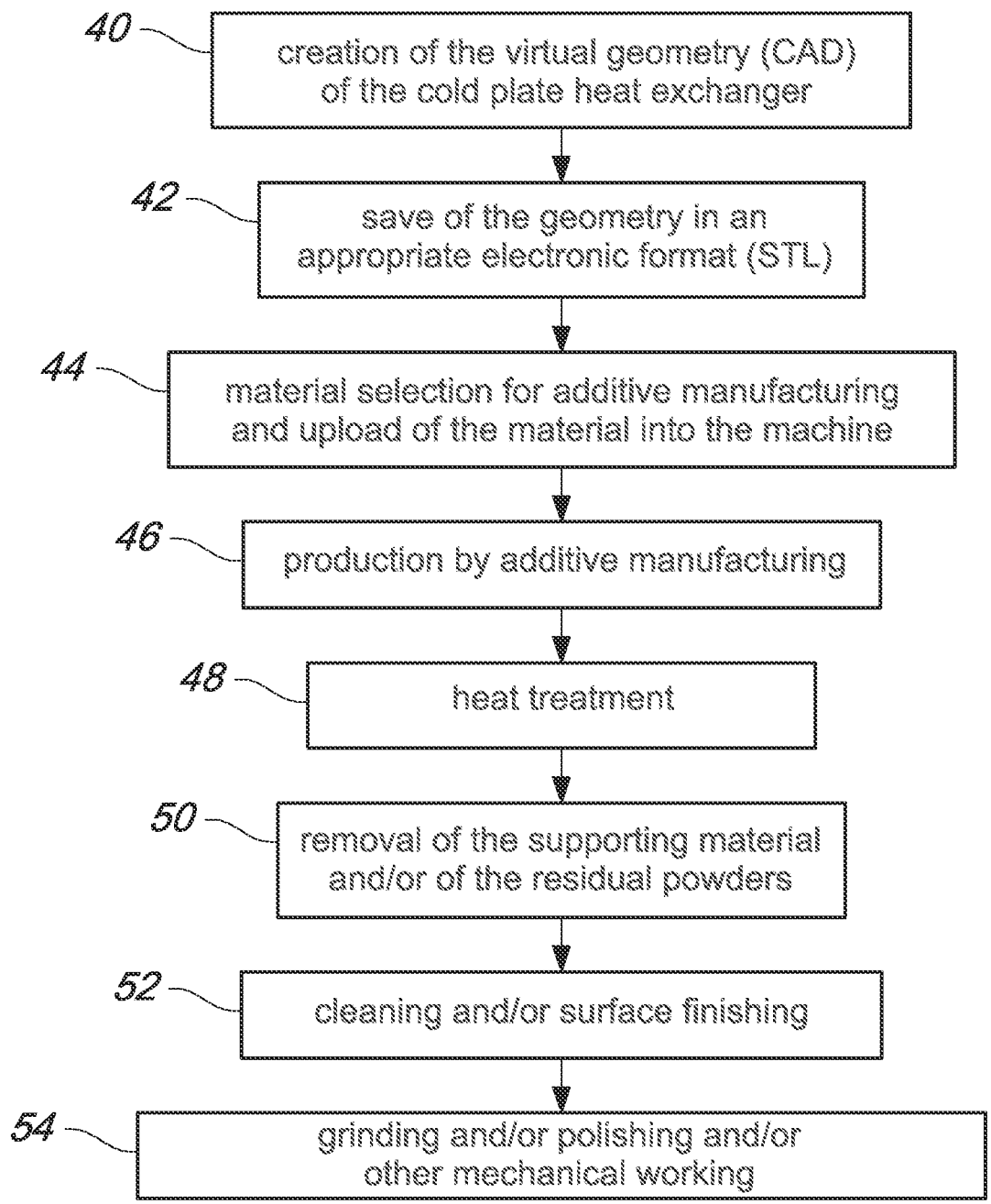

FIGS. from 15A to 15D display a top perspective view and three projected lateral views of a portion of an exemplary embodiment of the ordered lattice structure of the cold plate heat exchanger according to the present disclosure, in the case the structure itself is composed of the periodic repetition of one elementary cell along the axes x, y, z;

FIGS. from 16A to 16F display top perspective views of six different embodiments of the elementary cell of the ordered lattice structure of the cold plate heat exchanger according to the present disclosure;

FIG. 17 displays a section view of an exemplary embodiment of the cold plate heat exchanger according to the present disclosure, in the case its ordered lattice structure presents a stepwise variation;

FIG. 18 displays two graphs showing, respectively, the qualitative trend of the heat transfer and of the pressure drop of the coolant in the exemplary embodiment of the cold plate heat exchanger according to the present disclosure shown in FIG. 17;

FIGS. 19, 20 and 21 display, respectively, a top perspective exploded view, a lateral view and a section view, specifically along the XXI-XXI line in FIG. 20, of an exemplary embodiment of the cold plate heat exchanger according to the present disclosure, in the case its main body is divided into two portions;

FIG. 22 is a flow diagram schematically showing an exemplary embodiment of the production process by additive manufacturing of the cold plate heat exchanger according to the present disclosure;

FIG. 23 is a flow diagram schematically showing an alternative exemplary embodiment of the production process by additive manufacturing of the cold plate heat exchanger according to the present disclosure.

DETAILED DESCRIPTION

With reference to FIGS. 1 to 21, the cold plate heat exchanger according to the present disclosure, globally marked with the reference number 10, includes basically:

a main body 12 comprising at least one "active" surface 22 suitable to the heat transfer with at least one device 11 in thermal contact with the same;

at least one channel 14, in which a coolant flows, formed inside the main body 12 and at least partially filled with an ordered lattice structure 16 in thermal contact with the coolant; and at least two hydraulic interconnections 20 integral with the main body 12 and comprising the corresponding inlet and outlet ducts of the coolant hydraulically connected to the ends of the internal channel 14.

The main body 12 of the cold plate heat exchanger 10 according to the present disclosure may present basically the shape of a rectangular parallelepiped. The main body 12 of the cold plate heat exchanger 10 according to the present disclosure may present a planar (e.g. as displayed in FIG. 1), angular (e.g. as displayed in FIG. 10), or curvilinear shape (e.g. as displayed in FIG. 11). Consequently, the "active" surface 22 of the main body 12 may present a planar (e.g. as displayed in FIG. 1), angular (e.g. as displayed in FIG. 10), or curvilinear shape (e.g. as displayed in FIG. 11).

The main body 12 further comprises at least one "neutral" surface 26, different from the "active" surface 22, i.e. not suitable to the heat transfer, for instance the lateral surfaces with a smaller extension.

The internal channel 14 of the cold plate heat exchanger 10 according to the present disclosure, as already mentioned at least partially filled with an ordered lattice structure 16, is arranged in proximity of the "active" surface 22 and it is in thermal contact with the same. Further, the internal channel 14 may be shaped according to a main dimension d.

Preferably, the thickness of the wall of the main body 12 corresponding to the "active" surface 22 is minimised, in order to minimise consequently the conduction thermal resistance, which is given by the following expression:

$$R_i = \frac{t_i}{k_i}$$

where $t_i$ and $k_i$ are, respectively, the thickness and the thermal conductivity of the wall i corresponding to the "active" surface 22.

Figure 1:
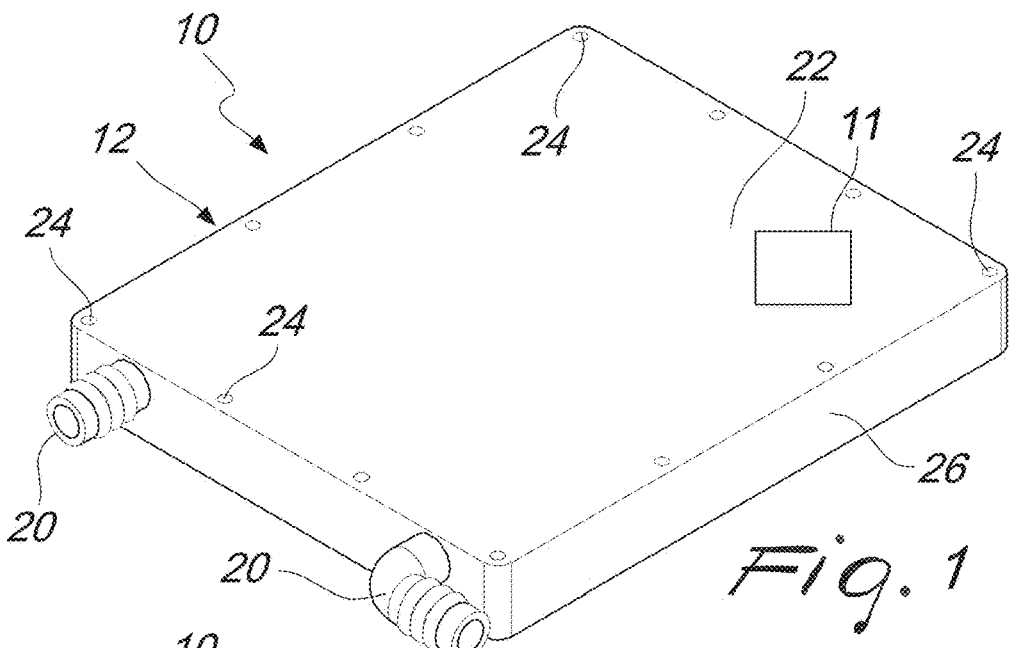
FIGS. 1, 2 and 3 display, respectively, a top perspective view, a lateral view and a section view, specifically along the III-III line in FIG. 2, of an exemplary embodiment of the cold plate heat exchanger according to the present disclosure, in the case its main body is planar.
Figure 2:
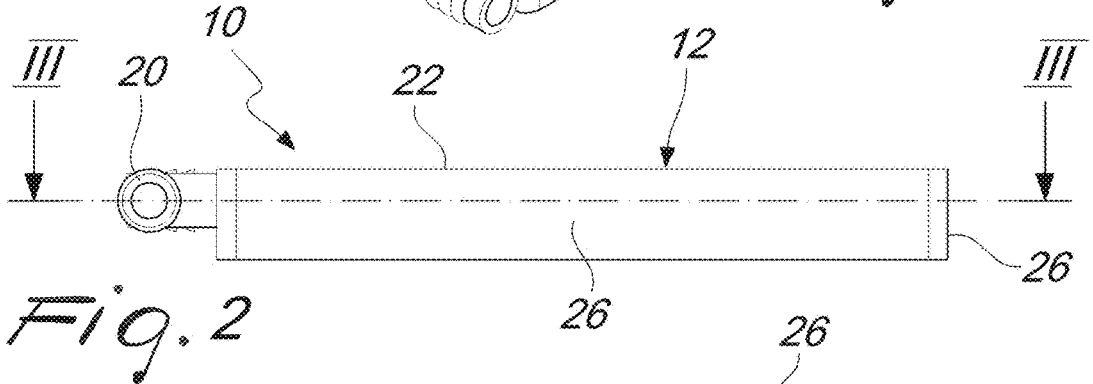
Figure 3:
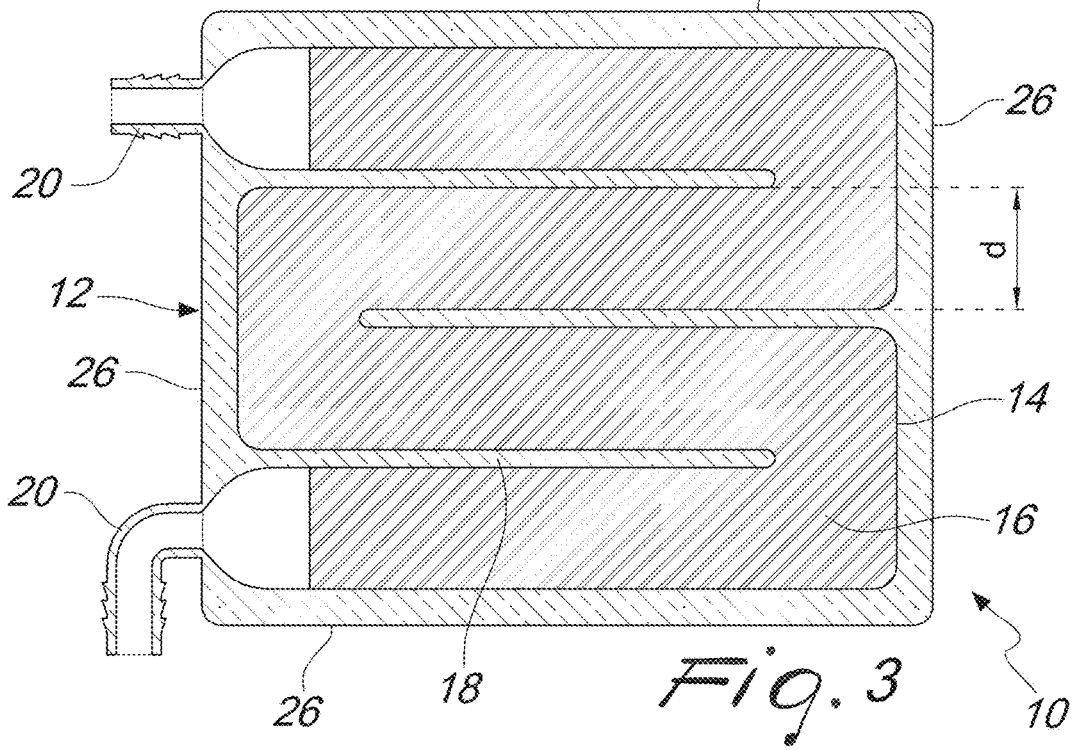
Figure 10:
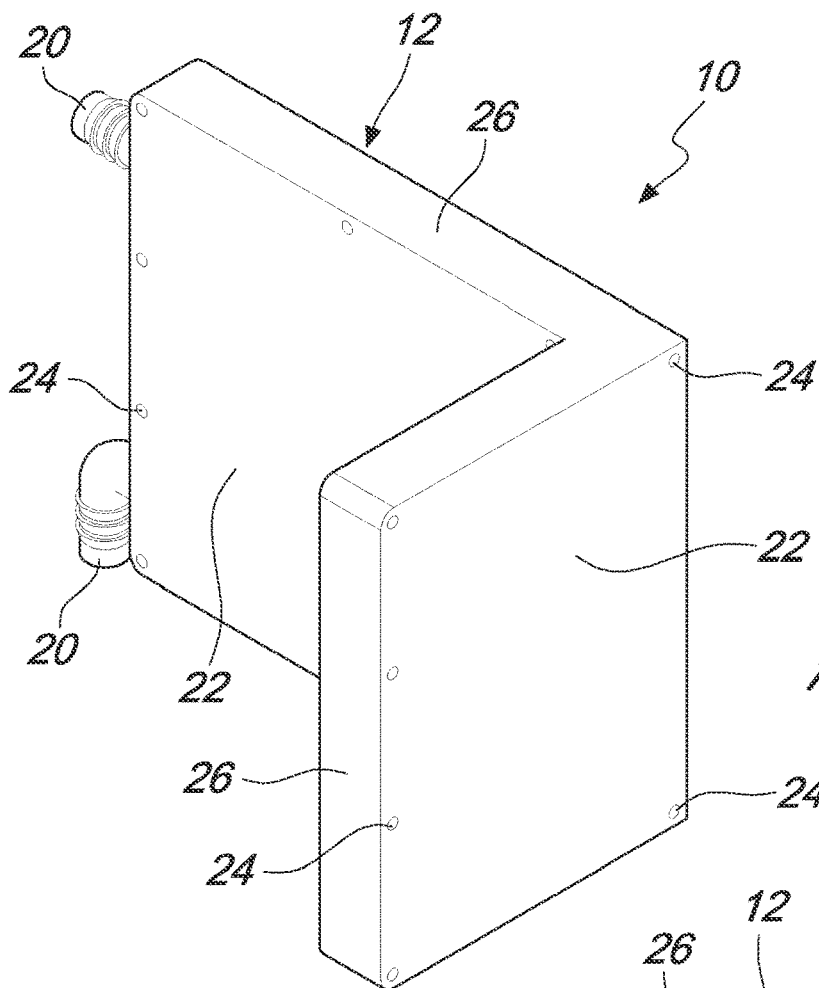
FIG. 10 displays a top perspective view of an exemplary embodiment of the cold plate heat exchanger according to the present disclosure, in the case its main body is angular.
Figure 11:
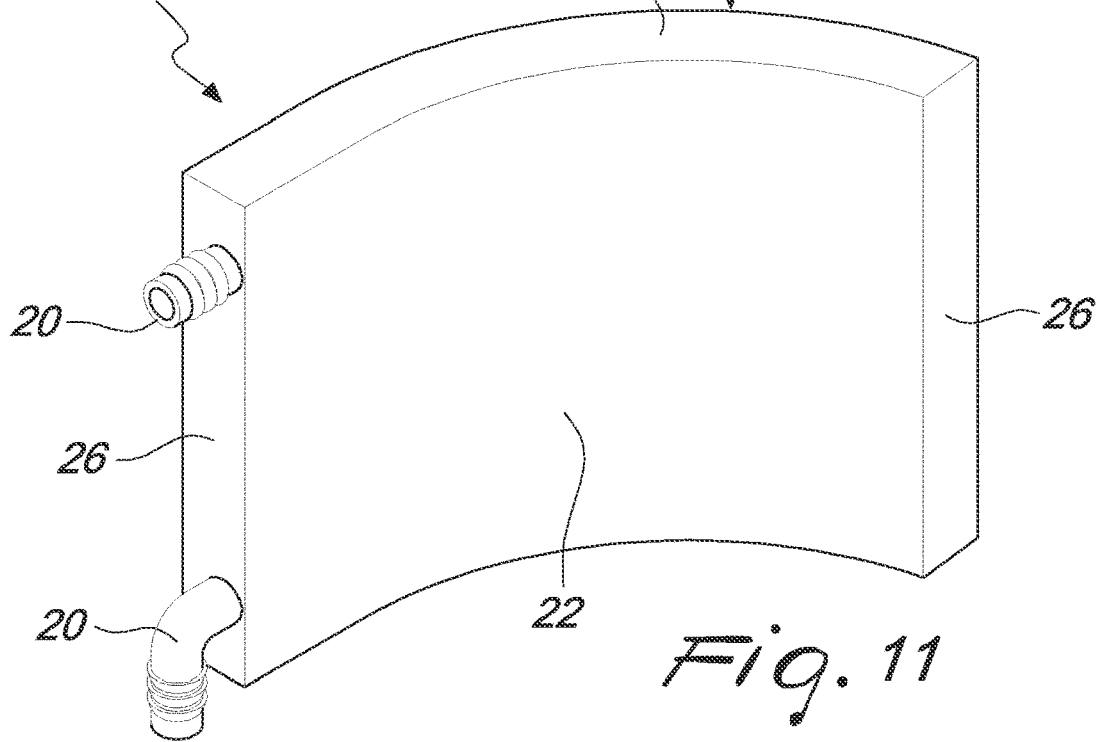
FIG. 11 displays a top perspective view of an exemplary embodiment of the cold plate heat exchanger according to the present disclosure, in the case its main body is curvilinear.
Figure 14:
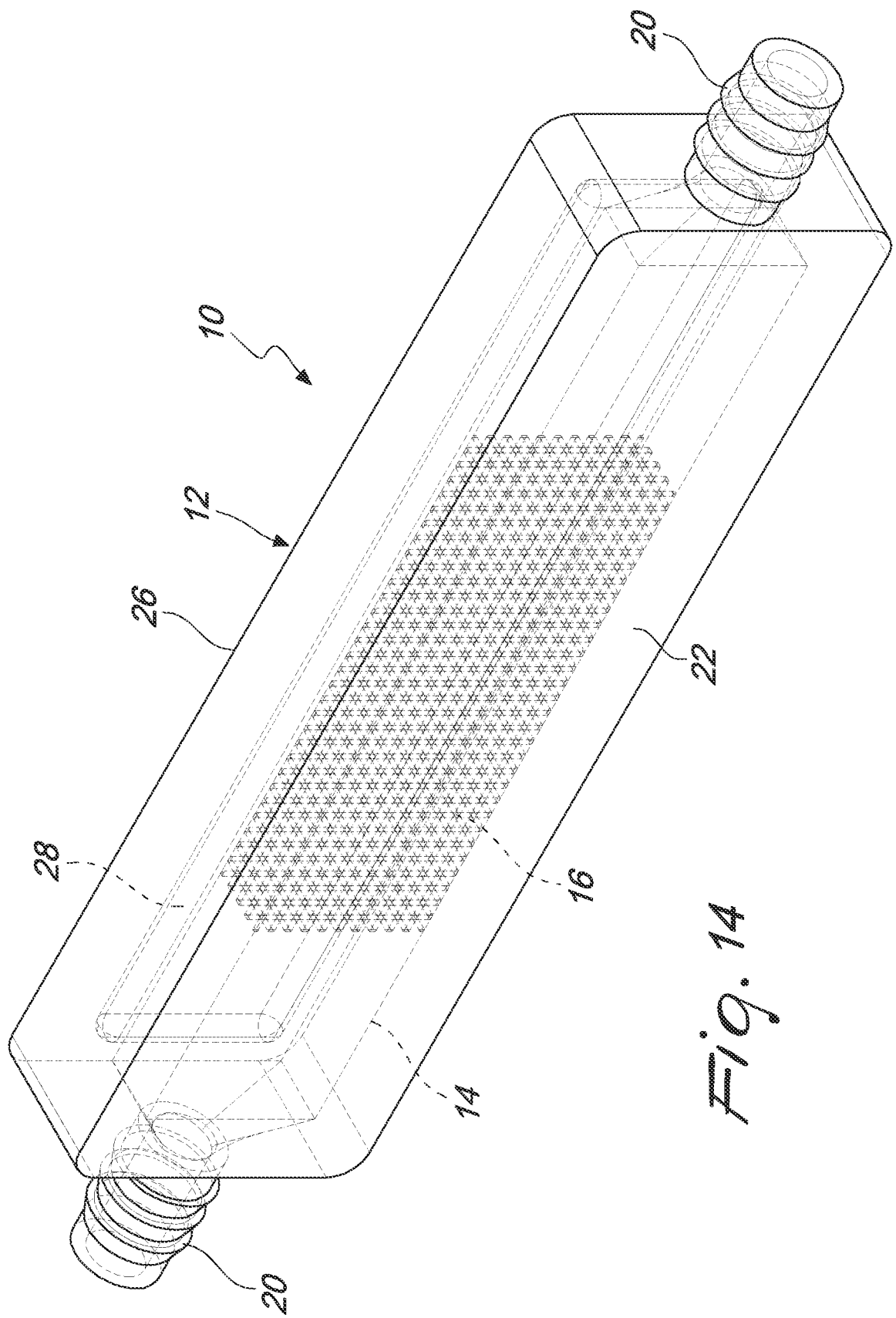
FIG. 14 displays a transparent top perspective view of an exemplary embodiment of the cold plate heat exchanger according to the present disclosure.
Figure 15A:
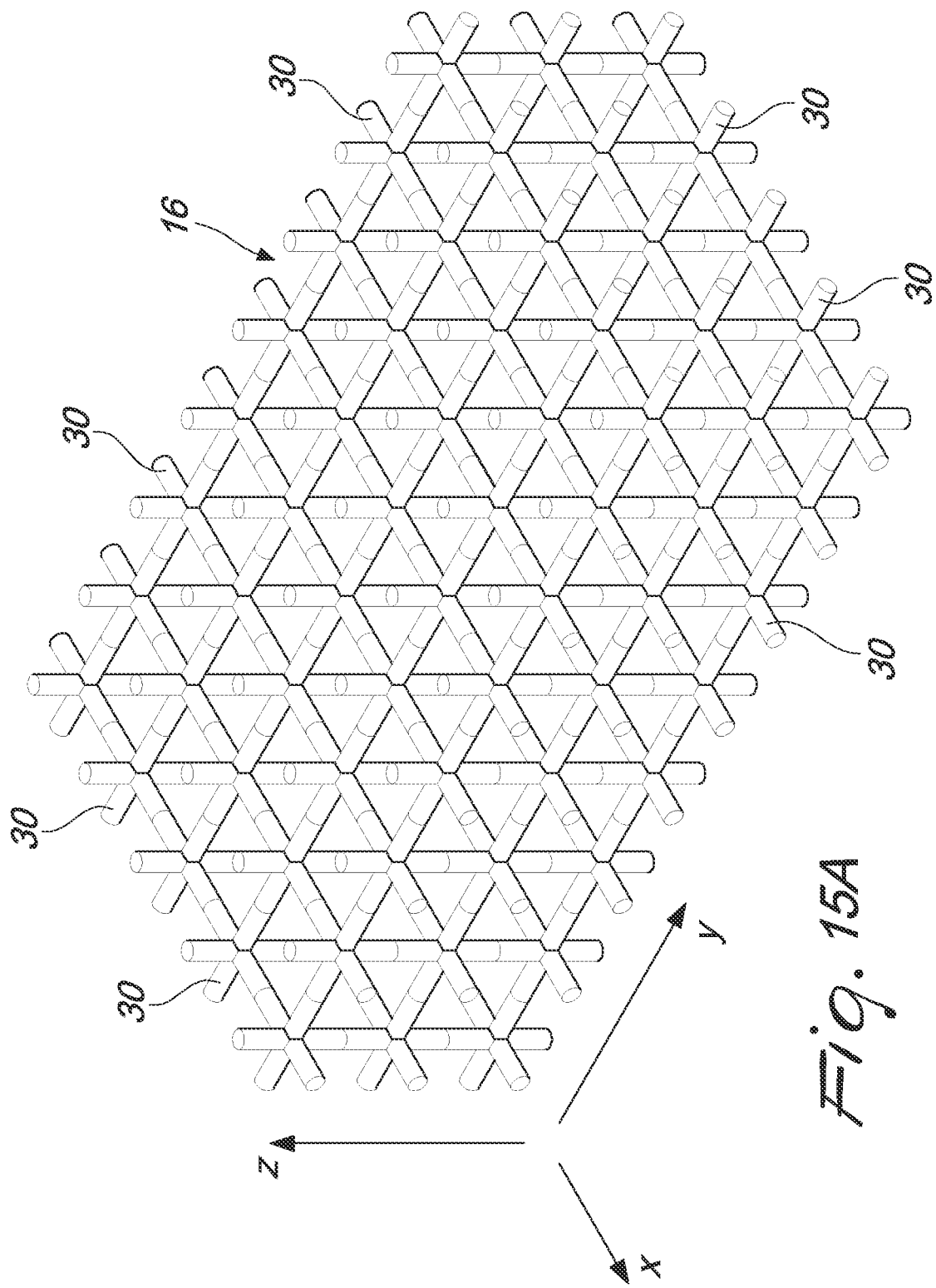
Figure 15B:
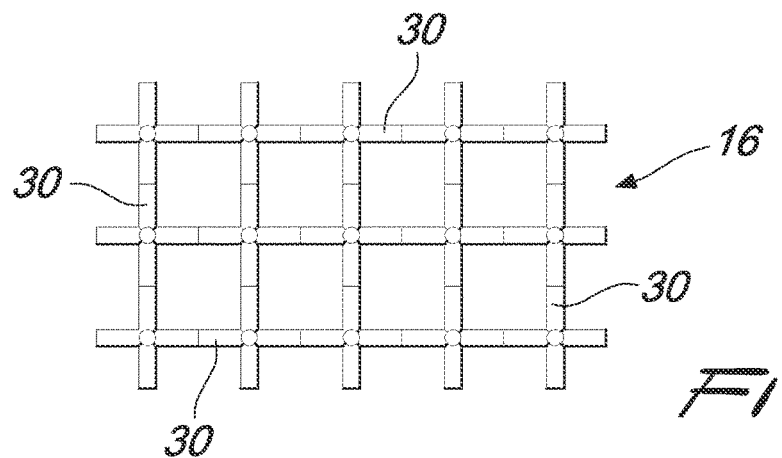
Figure 15C:
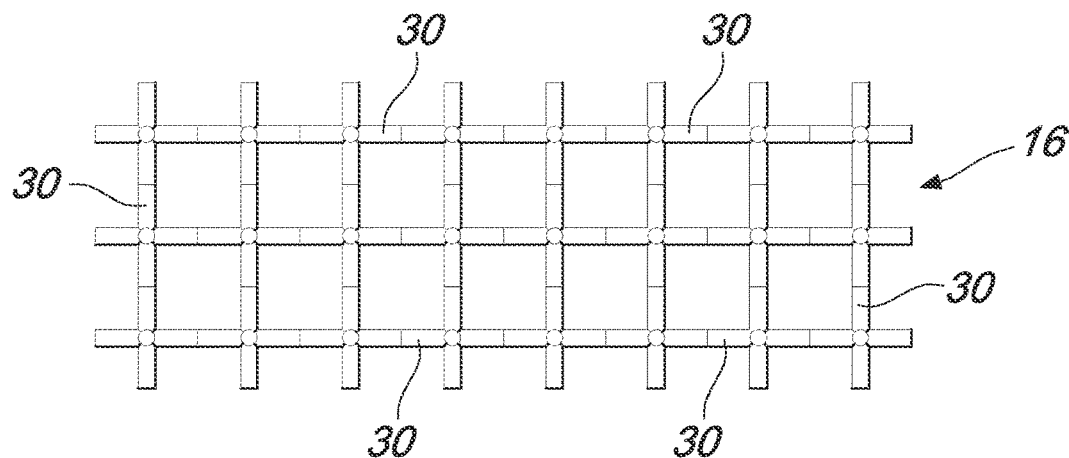
Figure 15D:
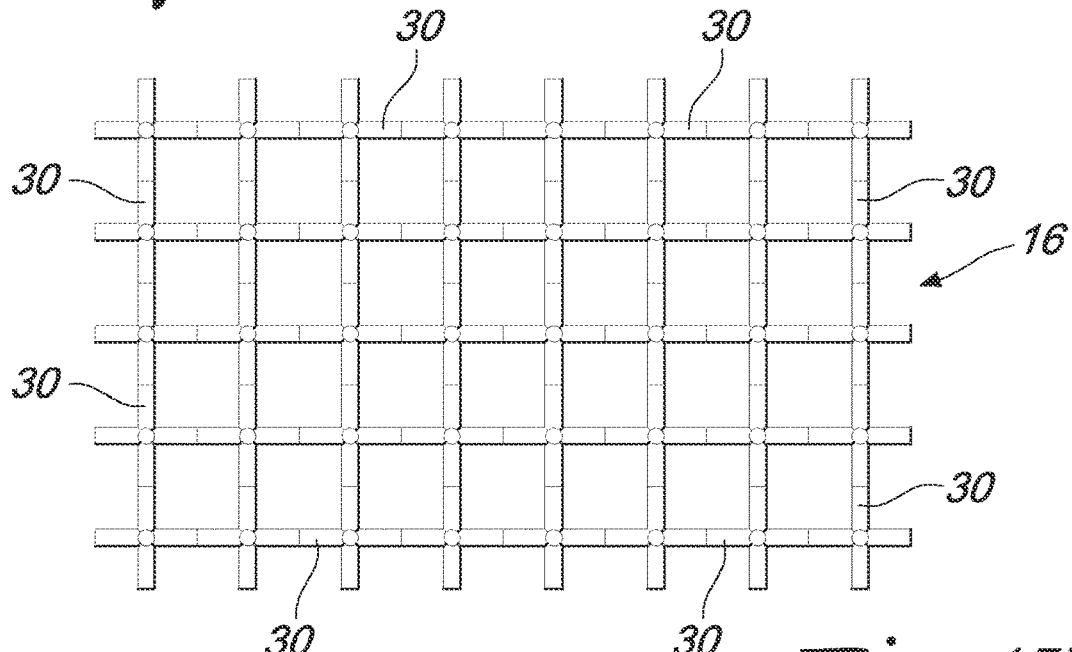

With specific reference to FIGS. 3 and 17, in some embodiments, the internal channel 14 of the cold plate heat exchanger 10 according to the present disclosure may present a coil shape comprising at least one U-shaped tract, preferably a plurality of subsequent U-shaped tracts located on the same plane or on parallel planes. In this case, the cold plate heat exchanger 10 according to the present disclosure additionally comprises at least one partition wall 18 of the internal channel 14. With specific reference to FIGS. 13, 14 and 19, in other embodiments, the internal channel 14 of the cold plate heat exchanger 10 according to the present disclosure may have a linear shape.

Preferably, the cold plate heat exchanger 10 according to the present disclosure additionally comprises connection parts 24, for instance a plurality of threaded holes, located on its external surface and suitable to the connection of the device to be cooled in thermal contact with the "active" surface 22.

With specific reference to FIGS. 4 and 5, in a first version of an embodiment, only one single surface 22 of the main body 12 of the cold plate heat exchanger 10 according to the present disclosure is "active", i.e. suitable to the heat transfer for cooling the device/s in thermal contact with the same.

In this first version, the internal channel 14 is arranged in proximity of the single "active" surface 22 and it is in thermal contact with the same. Preferably, the thickness of the main body 12 corresponding to the single "active" surface 22 is minimised, in order to minimise consequently the corresponding conduction thermal resistance.

Instead, the other surfaces 26 of the main body 12, different from the "active" surface 22, among which specifically the surface opposite to the "active" surface 22, are "neutral" i.e. not suitable to the heat transfer. Preferably, these "neutral" surfaces 26 are separated from the internal channel 14 by means of at least one (empty or filled with a thermally insulating fluid) interspace 28 and/or a thickness that is greater than the corresponding wall of said main body 12, in order to maximise, consequently, the conduction thermal resistance.

With specific reference to FIGS. 6 and 7, in a second version of an embodiment, both opposite surfaces 22, with a larger extension, of the main body 12 of the cold plate heat exchanger 10 according to the present disclosure are "active" i.e. suitable to the heat transfer for cooling the device/s in thermal contact with the same.

In this second version, the internal channel 14 is arranged in proximity of both "active" surfaces 22 and it is in thermal contact with the same. Preferably, the thickness of both walls of the main body 12 corresponding to the "active" surfaces 22 are minimised, in order to minimise, consequently, the corresponding conduction thermal resistances.

Instead, the other surfaces 26 of the main body 12, different from the "active" surfaces 22, among which specifically the lateral ones with a smaller extension, are "neutral" i.e. not suitable to the heat transfer. Preferably, these "neutral" surfaces 26 are separated from the internal channel 14 by means of at least one (empty or filled with a thermally insulating fluid) interspace 28 and/or a thickness that is greater than the corresponding wall of said main body 12, in order to maximise, consequently, the conduction thermal resistance.

With specific reference to FIGS. 8 and 9, in a third version of an embodiment, similar to the second version described above, both opposite surfaces 22, of larger extension, of the main body 12 of the cold plate heat exchanger 10 according to the present disclosure are "active" i.e. suitable to the heat transfer for cooling the device/s in thermal contact with the same.

However, in this third version, the cold plate heat exchanger 10 according to the present disclosure comprises a first internal channel 14' and a second internal channel 14", at least partially filled with a first ordered lattice structure 16' and with a second ordered lattice structure 16", respectively. Further, the two internal channels 14' and 14" may be shaped according to the main dimensions $d_1$ and $d_2$, respectively.

Therefore, the two internal channels 14' and 14" are not in thermal contact with both the "active" surfaces 22 at the same time, but the first internal channel 14' is arranged in proximity of one "active" surface 22 and it is in thermal contact with the same, whereas the second internal channel 14" is arranged in proximity of the opposite "active" surface 22 and it is in thermal contact with the same.

Basically, the two internal channels 14' and 14" are divided into two corresponding hydraulic circuits (in parallel and/or in series) that transfer a different amount of heat with the "active" surfaces 22. Preferably, the thickness of both walls of the main body 12 corresponding to the "active" surfaces 22 are minimised, in order to minimise, consequently, the corresponding conduction thermal resistances.

Instead, similar to the second version described above, the other surfaces 26 of the main body 12, different from the "active" surfaces 22, among which specifically the lateral ones with a smaller extension, are "neutral" i.e. not suitable to the heat transfer. Preferably, these "neutral" surfaces 26 are separated from the internal channel 14 by means of at least one (empty or filled with a thermally insulating fluid) interspace 28 and/or a thickness that is greater than the corresponding wall of said main body 12, in order to maximise, consequently, the conduction thermal resistance.

The configuration of this third version is optimal in the case the devices to be cooled, in thermal contact with the "active" surfaces 22, present different characteristics and thus generate a different amount of heat and with different volume and/or surface distributions.

In general, the main dimension d of the internal channels 14, in the case they are more than one, is chosen in order to minimise the pressure drop of the coolant that flows inside and, at the same time, to maximise the performance in terms of heat transfer. This optimal choice is realised when the corresponding dimensions $d_i$ of the internal channels 14 fulfil the condition defined by the following formula:

$$\frac{d_i}{L} \leq 2.26\left(\frac{\Delta PK}{\mu\alpha}\right)^{-\frac{1}{2}}$$

where L is a characteristic dimension (e.g. the maximum or average length) of the "active" surface 22 suitable to the heat transfer, $\Delta P$ is the pressure drop, K the equivalent permeability of the ordered lattice structure 16, µ the viscosity of the coolant, $\alpha$ the equivalent diffusivity of the ordered lattice structure 16, and 2.26 a multiplicative factor. The formula above is taken from Adrian Bejan, "Convection Heat Transfer", 4th Edition, John Wiley & Sons, 2013, USA.

The ordered lattice structure 16, which, as said, fills at least partially the internal channel 14, is suitable to maximise the surface available to the heat transfer between the coolant, which flows inside the same channel 14, and the cold plate heat exchanger 10 according to the present disclosure, specifically the corresponding main body 12 and more in detail the corresponding "active" surface 22.

With specific reference to FIGS. from 15A to 15D, the ordered lattice structure 16 comprises a plurality of elementary cells 30. This lattice structure 16 is "ordered" since it is composed of a periodic, preferably uniform, repetition of one or more elementary cells 30, specifically along one, two or three dimensions with reference to cartesian, spherical and/or cylindrical coordinates.

The elementary cells 30 composing the ordered lattice structure 16 may present various shapes. The elementary cells 30 may be based on a preferably cubic, but also prismatic, tetrahedral, hexahedral, octahedral or cylindrical, starting geometry. The elementary cells 30 may be obtained by the addition and/or subtraction and/or union and/or intersection of two or more solids and/or surfaces.

Figure 16D:
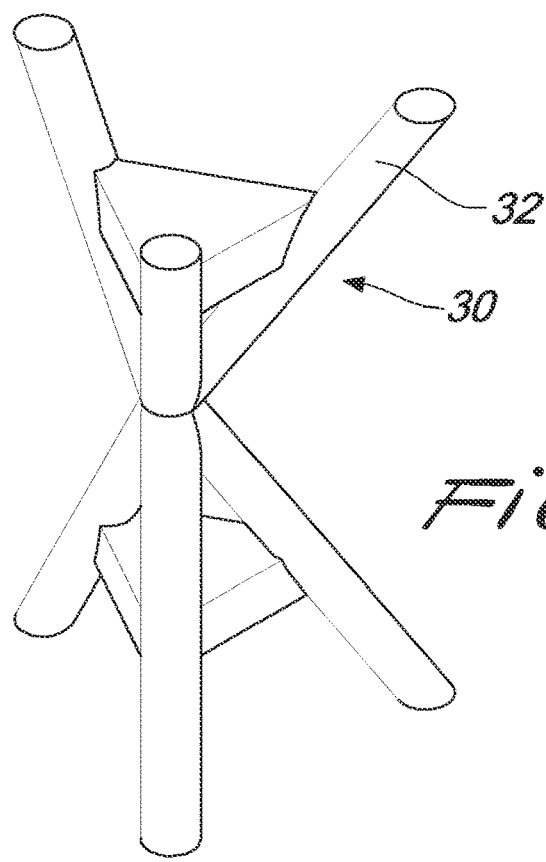
Figure 16E:
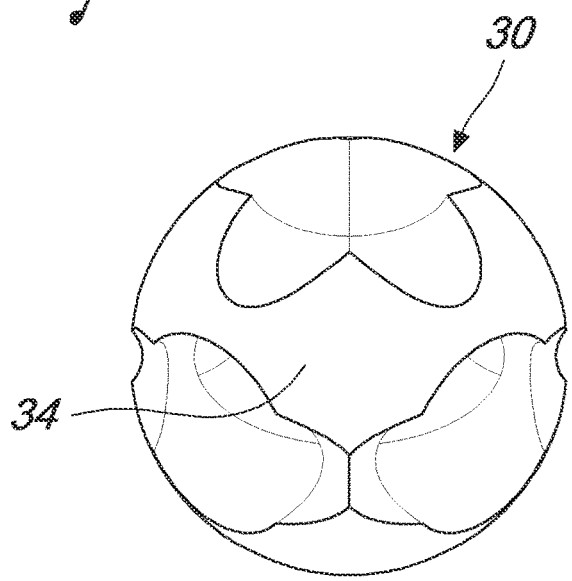
Figure 16F:
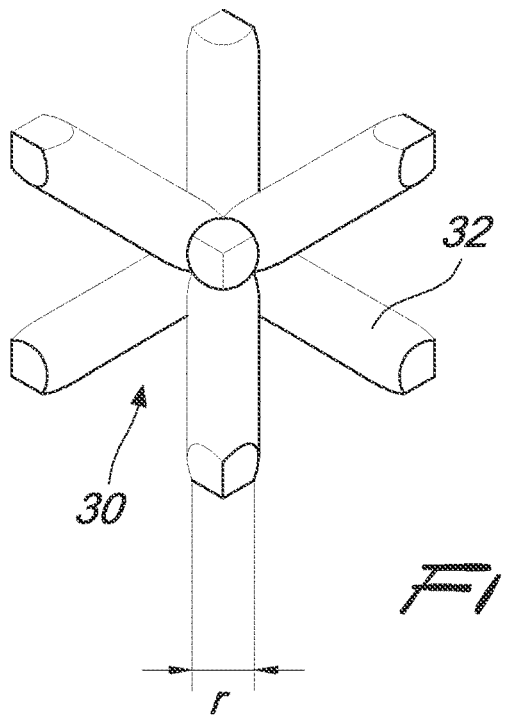

With specific reference to FIGS. 16A, 16D and 16F, in some embodiments, one elementary cell 30 may comprise one or more branches 32 of solid material that, starting from the vertices of the elementary cell 30, are connected at the center, on one or more faces, at one or more vertices and/or one or more edges of said cell. With specific reference to FIGS. 16B, 16C and 16E, in other embodiments, an elementary cell 30 may comprise one or more planar, angular and/or curvilinear surfaces 34 of solid material that compose the ordered lattice structure 16 by means of their self-intersection and/or the intersection among the same.

Obviously, the ordered lattice structure 16 may comprise elementary cells 30 of different geometries, for instance by alternating one elementary cell 30 comprising one or more branches 32, a second elementary cell 30 comprising one or more surfaces 34, and so on.

From the geometrical point of view, the elementary cells 30 of the ordered lattice structure 16 may be characterised by one or more dimensions chosen from the according to group:
- one or more characteristic lengths $L_c$ of said elementary cell 30;
- one or more diameters and/or characteristic thickness $t_c$ of the branches 32 and/or of the surfaces 34;
- one or more characteristic lengths $l_c$ of the branches 32 and/or of the surfaces 34;
- one or more angles $\alpha_c$ between the branches 32 and/or the surfaces 34; and one or more derived dimensions, e.g. the volume V of the elementary cell 30.

The elementary cells 30 of the ordered lattice structure 16 may be characterised by an equivalent porosity (p computed by the according to formula:

$$\varphi = \frac{V_{fluid}}{V}$$

where V is the total volume of the elementary cell 30, and $V_{fluid}$ is the volume theoretically available for the coolant.

Preferably, the elementary cells 30 of the ordered lattice structure 16, which as mentioned above fills at least partially the internal channel 14, present geometrical and/or mass and/or porosity characteristics that are not constant along said internal channel 14 of the cold plate heat exchanger 10 according to the present disclosure. In other words, the ordered lattice structure 16 may comprise a property gradient, i.e. a continuous and/or stepwise variation of the geometrical and/or mass and/or equivalent porosity characteristics of the elementary cells 30 which it is composed of.

The property gradient has the aim of tuning the performance, in terms of heat exchange, of the cold plate heat exchanger 10 according to the present disclosure, depending on the fractions of the "active" surface 22 of the main body 12 that require alternatively the transfer of a larger or smaller amount of heat.

With reference to the geometrical characteristics of the elementary cells 30 of the ordered lattice structure 16, the property gradient may be realised by means of one or more techniques chosen from the following group:
- increase or reduction of one or more characteristic lengths $L_c$ of said elementary cell 30;
- increase or reduction of one or more diameters and/or thickness $t_c$ of the branches 32 and/or of the surfaces 34;
- increase or reduction of one or more characteristic lengths $l_c$ of the branches 32 and/or of the surfaces 34; and
- increase or reduction of one or more angles $\alpha_c$ between the branches 32 and/or the surfaces 34.

Basically, these techniques produce the effect of increasing or reducing the equivalent porosity of the elementary cells 30, and thus their surface-to-volume ratio, which is directly linked to the performance in terms of heat transfer.

As mentioned above, in an exemplary embodiment, the internal channel 14 of the cold plate heat exchanger 10 according to the present disclosure is at least partially filled with an ordered lattice structure 16 comprising a stepwise variation of the geometrical and/or mass and/or equivalent porosity characteristics of the elementary cells 30 which it is composed of. Basically, in this embodiment, the internal channel 14 is at least partially filled with a plurality of portions of ordered lattice structure 16a, 16b, 16c, where the elementary cells 30 of each of these portions present different characteristics with respect to the elementary cells 30 of the corresponding adjacent portion.

For example, with specific reference to FIGS. 17 and 18, the internal channel 14 of the cold plate heat exchanger 10 may be at least partially filled with:
- a first and a fourth portion of an ordered lattice structure 16a, whose elementary cells 30 are characterised by a large equivalent porosity and/or a small surface-to-volume ratio;

a second portion of an ordered lattice structure 16b, whose elementary cells 30 are characterised by a medium equivalent porosity and/or a medium surface-to-volume ratio; and a third portion of an ordered lattice structure 16c, whose elementary cells 30 are characterised by a small equivalent porosity and/or a large surface-to-volume ratio.

The graph 66 displays the trend of the heat transfer corresponding to the different portions of the ordered lattice structure 16a, 16b, 16c of the internal channel 14 of the embodiment of the cold plate heat exchanger 10 according to the present disclosure. The graph 68 displays the trend of the pressure drop of the coolant corresponding to the different portions of the ordered lattice structure 16a, 16b, 16c of the internal channel 14 of the embodiment of the cold plate heat exchanger 10 according to the present disclosure.

The hydraulic interconnections 20 of the cold plate heat exchanger 10 according to the present disclosure, and consequently the corresponding inlet and outlet ducts of the coolant, are hydraulically connected or connectable to an external hydraulic circuit for the coolant. Specifically, the hydraulic interconnections 20, and consequently the corresponding inlet and outlet ducts of the coolant, are suitable to hydraulically connect the ends of the internal channel 14 to the external hydraulic circuit that forces the coolant flow inside said internal channel 14.

Preferably, the hydraulic interconnections 20 of the cold plate heat exchanger 10 according to the present disclosure present connections parts, e.g. a plurality of knurlings or grooves, located on their external surfaces and suitable to the connections of pipes or other hydraulic components for the connection to the external hydraulic circuit.

With specific reference to FIGS. 1, 3, 10, 11 and 17, in some embodiments, the hydraulic interconnections 20, and consequently the corresponding inlet and outlet ducts of the coolant, may be positioned on the same face of the main body 12 of the cold plate heat exchanger 10 according to the present disclosure.

With specific reference to FIGS. 12, 13, 14, 19 and 20, in other embodiments, the hydraulic interconnections 20, and consequently the corresponding inlet and outlet ducts of the coolant, may be positioned on different faces, e.g. opposite faces, of the main body 12 of the cold plate heat exchanger 10 according to the present disclosure.

In general, the position of the hydraulic interconnections 20 on the main body 12 of the cold plate heat exchanger 10 according to the present disclosure depends on the characteristics of the external hydraulic circuits and/or of the devices with which said heat exchangers 10 must be connected to.

Preferably, at least the "active" surface 22 of the main body 12 and the ordered lattice structure 16 of the cold plate heat exchanger 10 according to the present disclosure are manufactured with a thermally conductive material. Even more preferably, the whole cold plate heat exchanger 10 according to the present disclosure is manufactured with a thermally conductive material; specifically, the main body 12 comprising the "active" surface 22, the ordered lattice structure 16 that fills at least partially the channel 14 formed inside the main body 12, and the hydraulic interconnections 20 integral with the main body 12, are manufactured with a thermally conductive material.

In an embodiment, the whole cold plate heat exchanger 10 according to the present disclosure is manufactured with a thermally conductive metallic material, such as e.g. aluminium alloys, iron alloys, copper alloys, titanium alloys. In another embodiment, the whole cold plate heat exchanger 10 according to the present disclosure is manufactured with a polymeric material, such as e.g. PEEK (polyetheretherketone). In another embodiment, the whole cold plate heat exchanger 10 according to the present disclosure is manufactured with a polymer matrix composite material, reinforced with long and/or short fibers (e.g. glass and/or carbon fibers) and/or with particles.

With specific reference to FIGS. 19, 20 and 21, in an exemplary embodiment, the cold plate heat exchanger 10 according to the present disclosure is manufactured with two thermally conductive materials that present different values of thermal conductivity.

Specifically, a first portion of the main body 12a of the cold plate heat exchanger 10, comprising the "neutral" surfaces 26 where it is necessary to minimise the heat transfer towards the environment and thus the dispersion of heat, is manufactured with a small thermal conductivity material (e.g. PEEK). Preferably, this small thermal conductivity material guarantees however a structural resistance, minimizing the mechanical deformations during operation. Instead, a second portion of the main body 12b of the cold plate heat exchanger 10, comprising the "active" surface 22 and the ordered lattice structure 16, is manufactured with a large thermal conductivity material (e.g. aluminium or its alloys).

Preferably, the second portion of the main body 12b, as said realised with a material with large thermal conductivity, is manufactured by means of additive manufacturing, whereas the first portion of the main body 12a, as already mentioned above manufactured with a small thermal conductivity material, is manufactured by means of additive manufacturing and/or one or more additional conventional production processes (e.g. milling, turning, injection molding, etc.).

The junction between the first portion 12a and the second portion 2b of the main body of the heat exchanger 10 may be realised by hot or cold processes, by means of soldering and/or gluing and/or dap joint and/or threaded components and/or other reversible (e.g. screws, etc.) or irreversible (e.g. rivets, etc.) fixing components.

Preferably, the cold plate heat exchanger 10 according to the present disclosure further comprises at least one gasket 36 located along the junction between the first portion 12a and the second portion 12b of the main body and suitable to contain the coolant flowing in the internal channel 14.

In an embodiment, in the case the cold plate heat exchanger 10 is employed in the common cooling operation, the junction between the first portion 12a and the second portion 12b of the main body of the heat exchanger 10 may be realised so that the first portion 12a in a material with small thermal conductivity surrounds the second portion 12b in a material with large thermal conductivity. Thus, during operation, the different thermal expansion of the corresponding two materials allows a reinforcement of the junction itself and a minimization of the risk of hydraulic leaks, and also a minimization of the overall mechanical deformations. It is indeed known that the engineering materials with large thermal conductivity present also a larger thermal expansion coefficient.

In another embodiment, in the case the heat exchanger 10 is employed in the uncommon heating operation, the junction between the first portion 12a and the second portion 12b of the main body of the heat exchanger 10 may be realised so that the second portion 12b in a material with large thermal conductivity surrounds the first portion 12a in a material with small thermal conductivity. The reasons are analogous to those mentioned above.

In the case the heat exchanger 10 is employed in both cooling and heating operations, it is preferable the embodiment corresponding to the operation which is foreseen to be working for a longer duration.

Preferably, the cold plate heat exchanger 10 according to the present disclosure further comprises one or more electronic sensors, such as e.g. temperature and/or flow rate sensors.

Preferably, the cold plate heat exchanger 10 according to the present disclosure further comprises a surface temperature sensor arranged on the "active" surface 22 of the main body 12 of the cold plate heat exchanger 10. This surface temperature sensor is configured for measuring a temperature value in at least one point of said surface 22, thus acting also as temperature control of the device/s to be cooled.

Preferably, the cold plate heat exchanger 10 according to the present disclosure further comprises a channel temperature sensor arranged on the internal surface of the internal channel 14 of the heat exchanger 10 or of at least one hydraulic interconnection 20, and thus of at least one corresponding inlet or outlet duct of the coolant. This channel temperature sensor is configured for measuring a temperature value in at least one point of the coolant flowing in said internal channel 14.

Preferably, the cold plate heat exchanger 10 according to the present disclosure further comprises a channel flow rate sensor located on the internal surface of at least one hydraulic interconnection 20, and thus of at least one corresponding inlet or outlet duct of the coolant. This channel flow rate sensor is configured for measuring a (volume and/or mass) flow rate and/or velocity of the coolant flowing in said internal channel 14.

With reference to FIGS. 22 and 23, the production process by additive manufacturing of the cold plate heat exchanger 10 according to the present disclosure, as described above, comprises the following steps.

Initially, at step 40, a virtual geometry of the cold plate heat exchanger 10 is created at the computer (e.g. by means of Computer-Aided Design/Drafting, CAD), where said virtual geometry comprises the ordered lattice structure 16, which as said fills at least partially the internal channel 14 and comprises a periodic repetition, preferably uniform, of one or more elementary cells 30, specifically along one, two or three dimensions with reference to cartesian, spherical and/or cylindrical coordinates.

At step 42, said virtual geometry, generated at previous step, is saved in a suitable electronic format (e.g. STL).

At step 44, a base material (e.g. metallic powders) with which to manufacture the cold plate heat exchanger 10 is selected, and the subsequent upload of said material in an additive manufacturing machine is realised.

The steps from 40 to 44 described above are preliminary operations (pre-processing) to the actual additive manufacturing.

At step 46, the production of the cold plate heat exchanger 10 by means of the additive manufacturing machine (e.g. by means of laser sintering of the metallic powder bed) is realised, where said cold plate heat exchanger 10 comprises the ordered lattice structure 16, which as already described above fills at least partially the internal channel 14 and comprises a periodic repetition, preferably uniform, of one or more elementary cells 30, specifically along one, two or three directions with reference to cartesian, spherical and/or cylindrical coordinates.

Preferably, at step 48, a heat treatment of the cold plate heat exchanger 10, manufactured at the previous step, is realised, for relieving the accumulated mechanical stresses and/or deformations.

Preferably, at step 50, the supporting material and/or the residual base material outside or inside the heat exchanger 10, manufactured at previous step, is removed.

Preferably, at step 52, the cleaning and/or the surface finishing (e.g. by means of sandblasting) of the heat exchanger 10, manufactured at previous step, is realised.

Preferably, at step 54, the grinding and/or the polishing and/or other mechanical working on some areas (e.g. the "active" surface 22) of the cold plate heat exchanger 10, manufactured at previous step, is realised.

The steps from 48 to 54 described above are subsequent operations (post-processing) to the actual additive manufacturing.

As mentioned above, at step 54, the production process by additive manufacturing according to the present disclosure may comprise the grinding and/or polishing and/or mechanical working of at least one "active" surface 22 of the main body 12 of the heat exchanger 10, in order to reduce the natural roughness and guarantee a large contact area with the device/s to be cooled.

These additional mechanical working operations may be performed also on other areas of the cold plate heat exchanger 10, e.g. the boring of the through-all holes inside the hydraulic interconnections 20 and/or of the corresponding inlet and outlet ducts of the coolant.

In an embodiment, the whole heat exchanger 10 is manufactured by means of additive manufacturing of a thermally conductive metallic material, such as e.g. aluminium alloys, iron alloys, copper alloys, titanium alloys, and possible subsequent mechanical working. In another embodiment, the whole heat exchanger 10 is manufactured by means of additive manufacturing of a polymeric material, such as e.g. PEEK (polyetheretherketone), and possible subsequent mechanical working. In even another embodiment, the whole heat exchanger 10 is manufactured by means of additive manufacturing of a polymer matrix composite material, reinforced with short and/or long fibers (e.g. glass and/or carbon fibers) and/or with particles, and possible subsequent mechanical working.

With specific reference to FIG. 23, in an embodiment, during the production process by additive manufacturing according to the present disclosure it is possible to integrate one or more electronic sensors within the cold plate heat exchanger 10, specifically in the corresponding main body 12. In this way, the electronic sensors are incorporated in the thermally conductive material volume in which the heat exchanger 10 is manufactured.

As said, the cold plate heat exchanger 10 according to the present disclosure my comprise one or more electronic sensors chosen from the following group:

a surface temperature sensor arranged on the "active" surface 22 of the main body 12 of the heat exchanger 10;

a channel temperature sensor arranged on the internal surface of the internal channel 14 of the heat exchanger 10 or of at least one hydraulic interconnection 20, and thus of at least one corresponding inlet or outlet duct of the coolant; and a channel flow rate sensor located on the internal surface of at least one hydraulic interconnection 20, and thus of at least one corresponding inlet or outlet duct of the coolant.

In this embodiment, the virtual geometry of the cold plate heat exchanger 10, created at step 40 described above, comprises an empty volume corresponding to each seating in which an electronic sensors and (if present) the electrical wires connected to the same sensor will be positioned. This empty volume is approximately equal to the volume of the corresponding sensor and of the corresponding electrical wires (if present).

In this embodiment, the production process by additive manufacturing of the cold plate heat exchanger 10, as described above, according to the present disclosure further comprises the following steps, subsequent to the step 46 described above.

At step 56, the manufacturing of the cold plate heat exchanger by means of the additive manufacturing machine is paused, and at least one electronic sensor is positioned in the corresponding seating (i.e. empty volume) located within the one or more layers of the base material where the production process has been paused. Preferably, the possible electrical wires connected to said sensor are located so that they are accessible from the outside of the main body 12 of the cold plate heat exchanger 10.

At step 58, the production of the cold plate heat exchanger 10 by means of the additive manufacturing machine is resumed, keeping the electronic sensor positioned in the respective seating.

At step 60, a verification is performed, for instance on the basis of the virtual geometry of the heat exchanger 10, regarding the need of an additional interruption of the manufacturing of the heat exchanger 10 by means of the additive manufacturing machine for positioning at least one additional electronic sensor. In the case of a positive outcome, the production process by additive manufacturing goes back to step 56 described above. In the case of a negative outcome, the production process by additive manufacturing continues to step 48 described above.

The advantages obtained by the production process by additive manufacturing, with specific reference to the cold plate heat exchanger 10 according to the present disclosure, are:
  manufacturing of complex ordered lattice structures 16, also with elementary cells 30 with a large surface-to-volume ratio, otherwise not manufacturable with other production processes;
  realization of a surface roughness of the ordered lattice structures 16 in thermal contact with the coolant, flowing inside the internal channel 14, without the need of additional mechanical working, being this roughness beneficial for improving the performance in terms of heat transfer;
  integration in a single solution, and thus integral with the main body 12 of the cold plate heat exchanger 10, of the hydraulic interconnections 20 having the function of connecting the ends of the internal channel 14, where the coolant flows, to the external hydraulic circuit, and also of seatings, holes and/or threads needed for the assembly of other components;
  reduction of the overall weight of the cold plate heat exchanger 10, thanks to the manufacturing of empty structures, for instance by removing materials in non-critical areas from the thermal and/or structural point of view; and
  reduction in the number of junctions and components needed to manufacture the heat exchanger 10, preferably manufactured in one single component, and of accessory components normally present in heat exchanger, such as e.g. screws, gaskets, etc.

It has been verified, basically, that the present disclosure fully meets the foreseen aim and objectives. Specifically, the cold plate heat exchanger, and the corresponding production process by additive manufacturing, as disclosed, allow to overcome the qualitative limitations of the state of the art, since they allow to achieve a higher efficiency with respect to that obtainable with the known solutions, or a similar efficiency at a lower price and with better performance.

It is an advantage of the cold plate heat exchanger, and of the corresponding production process by additive manufacturing, according to the present disclosure, the possibility to minimise the maximum surface temperature of the same heat exchanger.

It is another advantage of the cold plate heat exchanger, and of the corresponding production process by additive manufacturing, according to the present disclosure, the possibility to maximise the uniformity in the surface temperature distribution of the same heat exchanger when subjected to non-uniform heat sources.

It is another advantage of the cold plate heat exchanger, and of the corresponding production process by additive manufacturing, according to the present disclosure, the possibility to obtain reduced volume and weight of the same heat exchanger for high-performance applications.

Also, it is another advantage of the cold plate heat exchanger, and of the corresponding production process by additive manufacturing, according to the present disclosure, the possibility to integrate additional functionalities in the same heat exchanger, for instance sensors.

Despite the cold plate heat exchanger according to the present disclosure is conceived in particular for the thermal management, i.e. the heat removal and thus the cooling, of rechargeable batteries, e.g. the prismatic Lithium-ion cells commonly used in hybrid and electric vehicles, it can be operated anyway, more in general, for the thermal management, i.e. the heat removal and thus the cooling, of any type (i.e. electronic, mechanical, etc.) of device.

As mentioned above, equivalently, the cold plate heat exchanger according to the present disclosure can be also operated in the heating function of any type (electronic, mechanical, etc.) of device, e.g. for the start-up at low temperatures of prismatic Lithium-ion cells.

The disclosure here conceived is open to several versions and modifications, all being within the field of the inventive concept. Additionally, all the details may be substituted by other elements that are technically equivalent.

Basically, the employed materials, when compatible with the specific operation, as well as the described dimensions and shape may vary depending on the needs and on the state of the art.

In conclusion, the sphere of protection of the claims must not be limited to the figures or the exemplary embodiments described in the description as examples, but rather the claims must comprise all the characteristics with patentable novelty that rely on the present invention, including the characteristics that could be dealt with as equivalent by the skilled person.

The invention claimed is:

1. A cold plate heat exchanger, comprising:
   at least one main body comprising at least one active surface suitable to heat transfer with at least one device in thermal contact with said at least one active surface;
   at least one channel, in which a coolant flows, formed inside said at least one main body and arranged in proximity to said at least one active surface and in thermal contact with said at least one active surface; and at least two hydraulic interconnections which are integral with said at least one main body and comprising respective inlet and outlet ducts of said coolant which are hydraulically connected to ends of said at least one internal channel;

wherein said at least one internal channel is at is at least partially filled with an ordered lattice structure in thermal contact with said coolant, said ordered lattice structure comprising a periodic repetition of one or more elementary cells along at least one dimension; and wherein:

said at least one main body further comprises at least one neutral surface not suitable to the heat transfer and separated from said at least one internal channel by means of at least one interspace and/or a wall thickness of said at least one main body corresponding to said at least one neutral surface that is greater with respect to a wall thickness of said at least one main body corresponding to said at least one active surface.

2. The cold plate heat exchanger according to claim 1, wherein said one or more elementary cells of said ordered lattice structure present a continuous and/or stepwise variation of geometric and/or mass and/or equivalent porosity characteristics.

3. The cold plate heat exchanger according to claim 2, wherein said at least one internal channel is at least partially filled with a plurality of portions of ordered lattice structure, wherein said one or more elementary cells of each one of said plurality of portions of ordered lattice structure present geometric and/or mass and/or equivalent porosity characteristics that are different with respect to said one or more elementary cells of a respective adjacent portion of ordered lattice structure.

4. The cold plate heat exchanger according to claim 1, wherein a first portion of said at least one main body is made of a material with small thermal conductivity, and a second portion of said at least one main body is made of a material with large thermal conductivity, said second portion comprising said at least one active surface and said ordered lattice structure, said first portion and said second portion being joined.

5. The cold plate heat exchanger according to claim 4, further comprising at least one gasket which is arranged along a joint between said first portion of said at least one main body and said second portion of said at least one main body.

6. The cold plate heat exchanger according to claim 4, wherein a joint between said first portion of said at least one main body and said second portion of said at least one main body is provided so that said first portion surrounds said second portion.

7. The cold plate heat exchanger according to claim 1, further comprising a surface temperature sensor arranged on said at least one active surface of said at least one main body and configured to detect a temperature value in at least one point of said at least one active surface.

8. The cold plate heat exchanger according to claim 1, further comprising a channel temperature sensor arranged on an internal surface of said at least one internal channel or of at least one of said at least two hydraulic interconnections and configured to detect a temperature value in at least one point of said coolant that flows in said at least one internal channel.

9. The cold plate heat exchanger according to claim 8, further comprising a channel flow rate sensor arranged on the internal surface of at least one of said at least two hydraulic interconnections and configured to detect a value of flow rate and/or velocity of said coolant that flows in said at least one internal channel.

10. A method for production by additive manufacturing of a cold plate heat exchanger, the method comprising:

computer-based generation of a virtual geometry of said cold plate heat exchanger, wherein said virtual geometry comprises an internal channel that is at least partially filled with an ordered lattice structure comprising a periodic repetition of one or more elementary cells along at least one dimension;

saving of said virtual geometry in an appropriate electronic format;

selection of a base material with which to manufacture said cold plate heat exchanger, and subsequent loading of said base material in an additive manufacturing machine; and production of said cold plate heat exchanger by means of said additive manufacturing machine, wherein said cold plate heat exchanger comprises said internal channel at least partially filled with said ordered lattice structure;

wherein said virtual geometry of said cold plate heat exchanger further comprises a main body comprising at least one active surface suitable to heat transfer with at least one device in thermal contact with said at least one active surface, being said internal channel formed inside said main body and arranged in proximity of said at least one active surface and in thermal contact with said at least one active surface;

wherein:

said main body further comprises at least one neutral surface not suitable to the heat transfer and separated from said internal channel by means of at least one interspace and/or a wall thickness of said main body corresponding to said at least one neutral surface that is greater with respect to a wall thickness of said main body corresponding to said at least one active surface.

11. The method for production by additive manufacturing according to claim 10, further comprising one or more steps selected from a group comprising:

thermal treatment on said cold plate heat exchanger;

removal of supporting material and/or of residual base material on an outside and/or inside of said cold plate heat exchanger;

surface cleaning and/or finishing of said cold plate heat exchanger; and grinding and/or polishing of said cold plate heat exchanger.

12. The method for production by additive manufacturing according to claim 10, wherein said virtual geometry of said cold plate heat exchanger further comprises an empty volume corresponding to at least one seating for at least one electronic sensor; and in that it further comprises:

interruption of said production of said cold plate heat exchanger by means of said additive manufacturing machine;

positioning of said at least one electronic sensor in a respective seating; and resumption of said production of said cold plate heat exchanger by means of said additive manufacturing machine, keeping said at least one electronic sensor positioned in said respective seating.

* * * * *